(12) United States Patent
Kao et al.

(10) Patent No.: US 12,278,250 B2
(45) Date of Patent: Apr. 15, 2025

(54) SEMICONDUCTOR DEVICE INCLUDING IMAGE SENSOR AND METHOD OF FORMING THE SAME

(71) Applicant: Taiwan Semiconductor Manufacturing Co., Ltd., Hsinchu (TW)

(72) Inventors: Min-Feng Kao, Chiayi (TW); Dun-Nian Yaung, Taipei (TW); Jen-Cheng Liu, Hsin-Chu (TW); Hsing-Chih Lin, Tainan (TW); Feng-Chi Hung, Chu-Bei (TW); Shyh-Fann Ting, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 616 days.

(21) Appl. No.: 17/321,909

(22) Filed: May 17, 2021

(65) Prior Publication Data

US 2022/0223635 A1    Jul. 14, 2022

Related U.S. Application Data

(60) Provisional application No. 63/135,085, filed on Jan. 8, 2021.

(51) Int. Cl.
*H01L 27/146* (2006.01)
(52) U.S. Cl.
CPC .... *H01L 27/1463* (2013.01); *H01L 27/14636* (2013.01); *H01L 27/1464* (2013.01); *H01L 27/14685* (2013.01)

(58) Field of Classification Search
CPC . H01L 27/146–14683; H01L 27/14689; H01L 27/1057; H01L 21/823406;
(Continued)

(56) References Cited

U.S. PATENT DOCUMENTS

2014/0246707 A1\* 9/2014 Koo .................... H01L 27/1464
257/230
2015/0255495 A1\* 9/2015 Park .................. H01L 27/14621
257/446

(Continued)

FOREIGN PATENT DOCUMENTS

JP          2019114728 A      7/2019
JP          2020126882 A      8/2020

*Primary Examiner* — Cuong B Nguyen
*Assistant Examiner* — Anthony A Pulatov
(74) *Attorney, Agent, or Firm* — Eschweiler & Potashnik, LLC

(57) ABSTRACT

A semiconductor device includes a substrate having a front side and a back side opposite to each other. A plurality of photodetectors is disposed in the substrate within a pixel region. An isolation structure is disposed within the pixel region and between the photodetectors. The isolation structure includes a back side isolation structure extending from the back side of the substrate to a position in the substrate. A conductive plug structure is disposed in the substrate within a periphery region. A conductive cap is disposed on the back side of the substrate and extends from the pixel region to the periphery region and electrically connects the back side isolation structure to the conductive plug structure. A conductive contact lands on the conductive plug structure, and is electrically connected to the back side isolation structure through the conductive plug structure and the conductive cap.

20 Claims, 29 Drawing Sheets

(58) Field of Classification Search
CPC .............................. H01L 29/765–76891; H01L 29/66946–66962; H01L 31/00–208
See application file for complete search history.

(56) References Cited

U.S. PATENT DOCUMENTS

| | | |
|---|---|---|
| 2016/0148959 A1 | 5/2016 | Cheng et al. |
| 2019/0148457 A1 | 5/2019 | Lee et al. |
| 2020/0058549 A1 | 2/2020 | Choi et al. |
| 2020/0227455 A1 | 7/2020 | Lee et al. |
| 2020/0279877 A1 | 9/2020 | Kim |
| 2021/0183930 A1 | 6/2021 | Takatsuka |
| 2021/0335862 A1 | 10/2021 | Lee et al. |

\* cited by examiner

SEMICONDUCTOR DEVICE INCLUDING IMAGE SENSOR AND METHOD OF FORMING THE SAME

REFERENCE TO RELATED APPLICATION

This Application claims the benefit of U.S. Provisional Application No. 63/135,085, filed on Jan. 8, 2021, the contents of which are hereby incorporated by reference in their entirety.

BACKGROUND

Many modern day electronic devices (e.g., digital cameras, optical imaging devices, etc.) include image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) pixel sensors and complementary metal-oxide-semiconductor (CMOS) pixel sensors. CMOS image sensors are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 5A and FIG. 5B to FIG. 14 are cross-sectionals views illustrating intermediate stages in a method of forming a semiconductor device according to some embodiments of the disclosure.

DETAILED DESCRIPTION

Figure 1A:
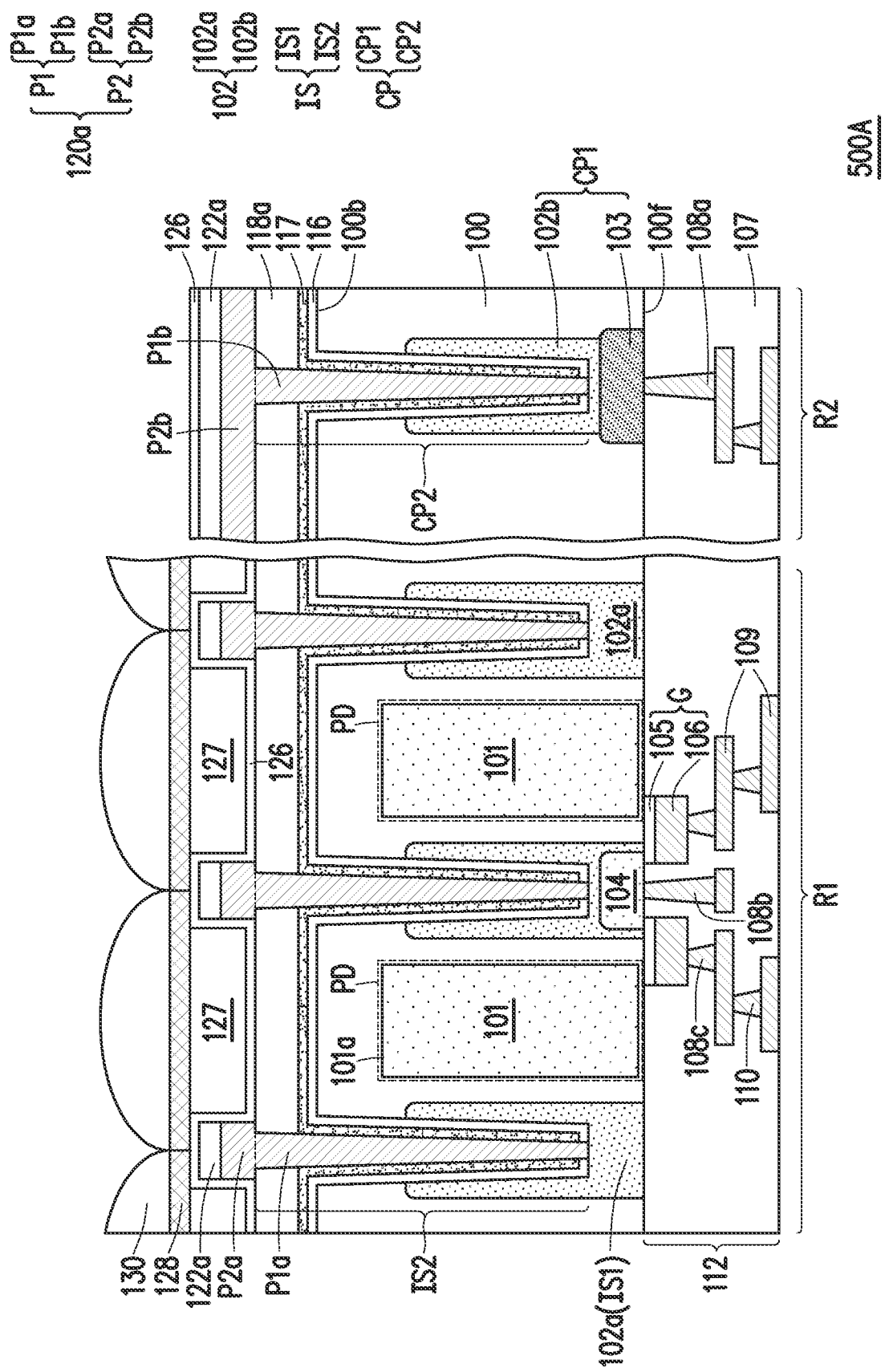
FIG. 1A and FIG. 1B are schematic cross-sectional views illustrating a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Figure 1B:
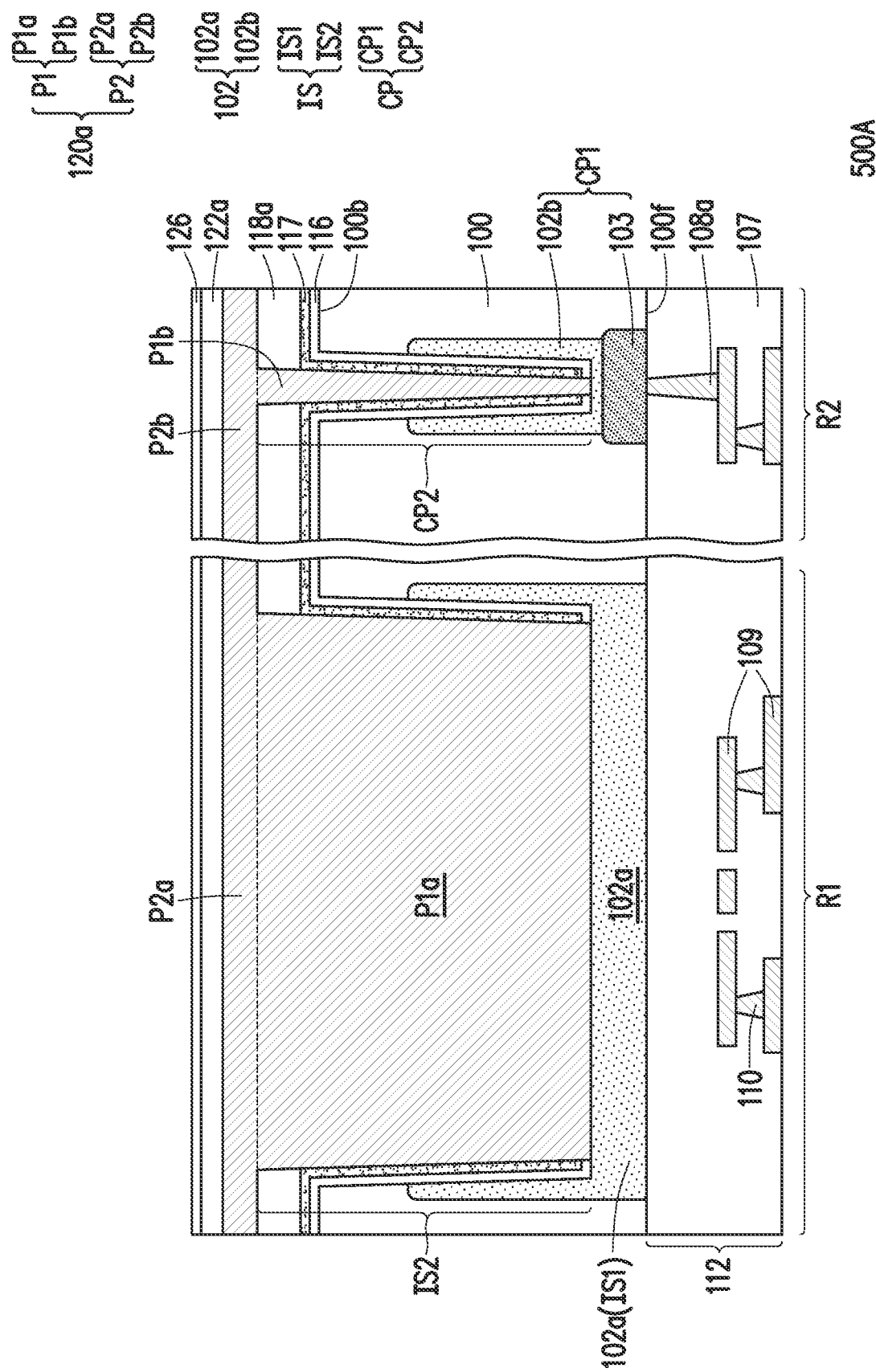
Figure 3A:
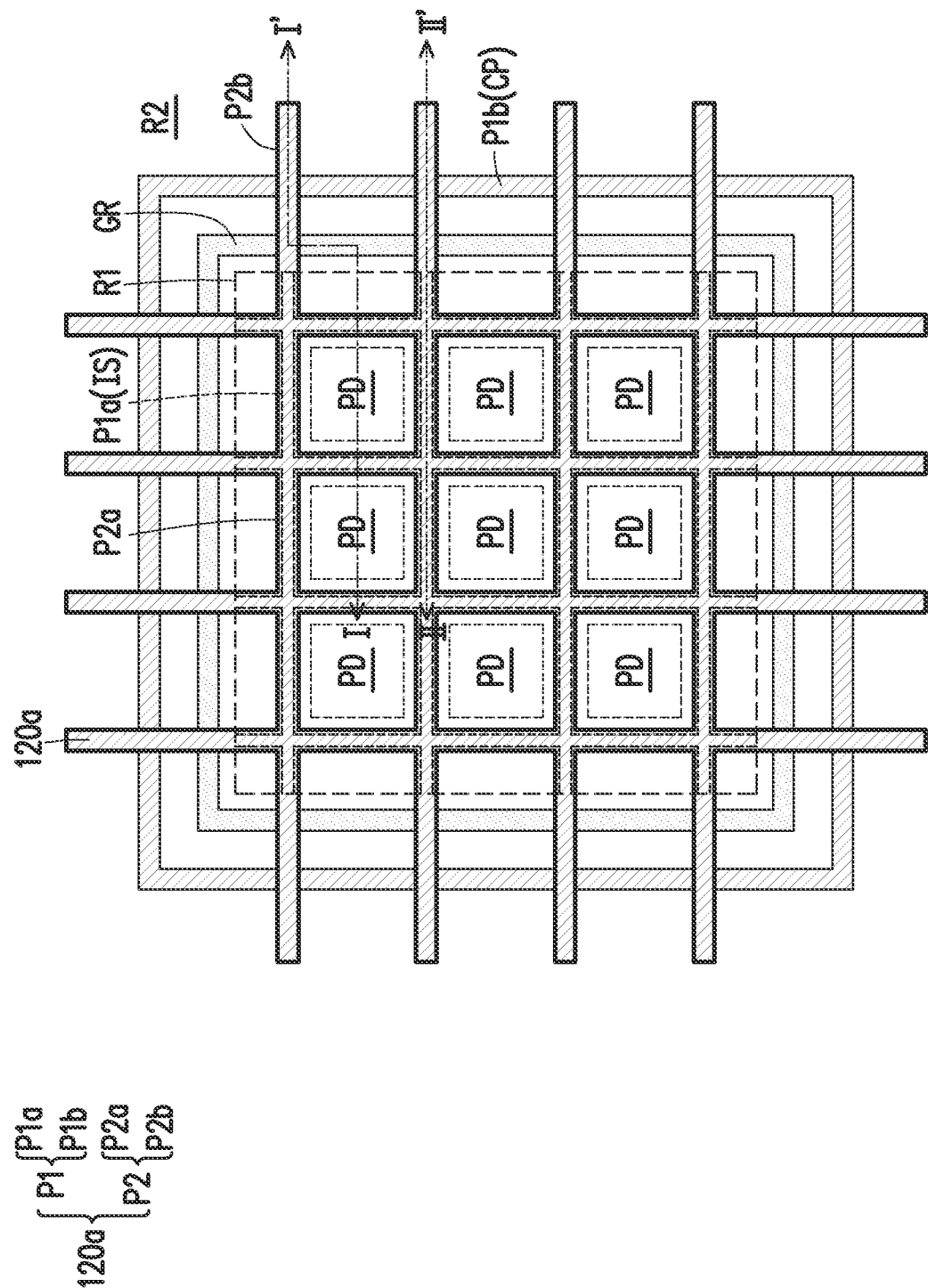
FIG. 3A to FIG. 3D are top views of semiconductor devices according to some embodiments of the disclosure.

FIG. 1A and FIG. 1B schematically illustrate cross-sectional views of a semiconductor device according to some embodiments of the disclosure. FIG. 3A schematically illustrates a top view of a semiconductor device according to some embodiments of the disclosure. FIG. 1A and FIG. 1B are taken along line I-I' and line II-II' of FIG. 3A, respectively.

FIG. 1A and FIG. 1B illustrate a semiconductor device 500A. The semiconductor device 500A may be or include an image sensor, such as a complementary metal oxide semiconductor (CMOS) image sensor, and may be or comprised in an image sensor die.

Referring to FIG. 1A and FIG. 3A, in some embodiments, the semiconductor device 500A includes a first region R1 and a second region R2. The first region R1 may be a pixel region, while the second region R2 may be a periphery region, such as a logic region. As shown in FIG. 3A, the pixel region R1 may be surrounded by the periphery region R2. In some embodiments, a boundary region may be disposed between the pixel region R1 and the periphery region R2. The boundary region may include one or more guard rings GR for separating the pixel region R1 and the periphery region R2, for example. The guard ring(s) GR may include any suitable isolation structure including insulating materials, such as a shallow trench isolation (STI) structure, a deep trench isolation (DTI) structure, or the like, or a combination thereof. It is noted that merely a portion (e.g., a center portion) of the pixel region is shown in the top view FIG. 3A for illustration. Further, for the sake of brevity, the boundary region with guard rings GR is not shown in the cross-sectional views.

In some embodiments, the semiconductor device 500A includes a substrate 100 having a front surface 100f and a back surface 100b opposite to each other. Accordingly, the side of the substrate 100/semiconductor device 500A having or close to the front surface 100f may be referred to as the front side of the substrate 100/semiconductor device 500A, while the side of the substrate 100/semiconductor device 500A having or close to the back surface 100b may be referred to as the back side of the substrate 100/semiconductor device 500A.

The substrate 100 is a semiconductor substrate. Depending on the requirements of design, the substrate 100 may be a p-type substrate, an n-type substrate or a combination thereof and may have doped regions (e.g., an N-type well and/or a P-type well) therein. A plurality of photodetectors PD are disposed in the substrate 100 within the pixel region R1. The photodetectors PD may be or include photodiodes. In some embodiments, the photodetectors PD are configured to convert incident radiation or incident light (e.g., photons), for example, from the back side of the substrate 100 into an electric signal. A photodetector PD may include a first doped region 101 having a first doping type. In some embodiments, the photodetector PD may have a second doped region 101a adjoining the first doped region 101 and having a second doping type opposite to the first doping type. In some embodiments, the first doping type may be n-type, and the second doping type may be p-type, or vice versa. The second doped region 101a may be disposed to surround (e.g., all around) the first doped region 101, but the disclosure is not limited thereto. In some embodiments, the second doped region 101a may be disposed on one or more sides of first doped region 101. For example, the second doped region 101a may be disposed on a front side of the first doped region 101 and between the first doped region 101 and the front surface 100f of the substrate 100. In some embodiments, the substrate 100 is a p-type substrate and the second doped region 101a may be a portion of the substrate 100 surrounding the first doped region 101. However, the disclosure is not limited thereto.

The photodetectors PD extend from the front side of the substrate 100 to positions in the substrate 100. Although the photodetectors PD are shown as having uniform widths from top to bottom, the disclosure is not limited thereto. In some embodiments, a width of a photodetector PD close to the front side of the substrate 100 is larger than the width of the photodetector PD close to the back side of the substrate 100. For example, the width of photodetector PD may gradually decrease in a direction perpendicular to the substrate 100 from the front side to the back side thereof. In some embodiments, the first doped region 101 of a photodetector PD has a concentration gradually decreasing in a direction perpendicular to the substrate 100 from the front side to the back side thereof. It is noted that, the shapes, configurations and sizes of doped regions of the photodetectors PD shown in the figures are merely for illustration, and the disclosure is not limited thereto.

Referring to FIG. 1A and FIG. 3A, in some embodiments, the photodetectors PD are laterally spaced apart from each other, and may be arranged in an array having column(s) and/or row(s). It is noted that the number of the photodetectors PD shown in the figures is merely for illustration, and the disclosure is not limited thereto. The pixel region R1 may include any suitable number of photodetectors PD disposed therein, depending on product design.

In some embodiments, a plurality of doped regions 102 having the second doping type (e.g., p-type) are disposed in the substrate 100 laterally aside the photodetectors PD. The doped regions 102 may also be referred to as well regions, such as p-well regions. In some embodiments, the well regions 102 include well region(s) 102a disposed in the pixel region R1 and well region(s) 102b disposed in the periphery region R2. In some embodiments, the well regions 102a may extend continuously around the photodetectors PD, are disposed laterally surrounding the respective photodetectors PD, and serve as a portion of the isolation structure between and separating the photodetectors PD. The well regions 102a may also be referred to as a doped isolation structure. In some embodiments, the well regions 102a may be configured to have a grid shape or a mesh shape.

The well region 102b is disposed within the periphery region R2. In some embodiments, a doped region 103 having the second doping type is disposed between the well region 102b and the front surface 100f of the substrate 100. The doped region 103 and the well region 102b have the same conductivity type, and the doping concentration of the doped region 103 is larger than the well region 102b. Accordingly, the doped region 103 may also be referred to as a heavily doped region. In the embodiments in which the second doping type is p-type, the doped region 103 may be referred to as a p+ doped region. The doped region 103 may have a width larger than that of the doped region 102b. In the embodiments, heavily doped regions 103 are not disposed between the well regions 102a and the front surface 100f of the substrate 100 within the pixel region R1, thereby avoiding physical contact between the heavily doped regions (e.g., P+ doped regions) and the doped regions 101 of the photodetectors PD, and thus avoiding the formation of undesired P-N junctions between the photodetectors PD and the heavily doped regions, especially when pixel region R1 shrinks. Therefore, issues such as leakage current that may be caused by the undesired P-N junctions are avoided.

While the doped regions 101 are illustrated as being rectangular, it is to be appreciated that the doped regions 101 may practically have a less uniform, less rectilinear shape. For example, the doped regions 101 may be blob-like and/or surfaces of the doped regions 101 may be non-uniform and/or wavy. If heavily doped regions 103 were present between the well regions 102a and the front surface 100f, some corners and/or edges of the doped regions 101 may get be too close to the heavily doped regions 103 and cause the undesired P-N junctions described above. Therefore, by omitting the heavily doped regions 103 between the well regions 102a and the front surface 100f, the undesired P-N junctions may be avoided and leakage current may be reduce.

In some embodiments, a doped region 104 may be disposed aside the photodetectors PD or between adjacent photodetectors PD. The doped region 104 has the first doping type and may be disposed in the well region 102a.

Still referring to FIG. 1A, in some embodiments, transfer gates G are disposed over the front side of the substrate 100 and are coupled to the photodetectors PD. A transfer gate G is disposed at a position between the corresponding photodetector PD and the doped region 104. In some embodiments, the transfer gate G is partially overlapped with the corresponding photodetector PD and the doped region 104 in a direction perpendicular to the front surface 100f of the substrate 100. The transfer gate G is configured to selectively form a conductive channel between the corresponding photodetector PD and the doped region 104, such that charge accumulated in the corresponding photodetector PD (e.g., via absorbing the incident radiation) may be transferred to the doped region 104. In some embodiments, the transfer gate G may include a gate dielectric layer 105 and a gate electrode 106 disposed on the gate dielectric layer 105.

An interconnection structure 112 is disposed on the front side of the substrate 100. In some embodiments, the interconnection structure 112 includes a dielectric structure 107 and a plurality of conductive features embedded in the dielectric structure 107. In some embodiments, the dielectric structure 107 includes a plurality of dielectric layers, such as inter-layer dielectric layers (ILDs) and inter-metal dielectric layers (IMDs). The conductive features may include multiple layers of conductive lines 109, conductive vias 110, and conductive contacts 108a-108c. The conductive vias 110 may be disposed in the IMDs to electrically connect the conductive lines 109 in different tiers. The conductive contacts 108a, 108b, 108c may be disposed in the ILDs and electrically connect the heavily doped region 103, the doped region 104, and the transfer gates G to the conductive lines 109, respectively.

Still referring to FIG. 1A, in some embodiments, a conductive structure 120a partially penetrates through the substrate 100 and extends from the back side of the substrate 100 to the well regions 102. In some embodiments, a dielectric layer 118a is disposed over the back surface 100b of the substrate, and the conductive structure 120a further penetrates through the dielectric layer 118 and protrudes above the dielectric layer 118a. In other words, the conductive structure 120a includes first portions P1 and second portions P2 on the first portions P1. The first portions P1 are embedded in the substrate 100 and the dielectric layer 118a, and are electrically coupled to the well regions 102, while the second portions P2 protrude from the top surface of the dielectric layer 118a and are electrically connected to the first portions P1. In some embodiments, the first portions P1 extend into and are partially embedded in the well regions 102, and the bottom surfaces of the first portions P1 are lower than the top surfaces of the well regions 102. However, the disclosure is not limited thereto. In some other embodiments, the first portions P1 may land on the top surfaces of the well regions 102, such that the bottom surfaces of the first portions P1 may be in contact with the topmost surfaces of the well regions 102.

In some embodiments, a dielectric layer 116 and a spacer layer 117 may be disposed between sidewalls of the first portions P1 of the conductive structure 120a and the substrate 100, and may be further disposed between the dielectric layer 118a and the back surface 100b of the substrate 100. The spacer layer 117 is disposed between the first portions P1 of the conductive structure 120a and the dielectric layer 116, and/or between the dielectric layer 116 and the dielectric layer 118.

The first portions P1 of the conductive structure 120a may also be referred to as conductive plugs or conductive vias, and the second portions P2 of the conductive structure 120a may also be referred to as a conductive cap. In some embodiments, the combination of the conductive plugs P1 and portions of the dielectric layer 116 and the spacer layer 117 covering sidewalls of the conductive plugs P1 may also be referred to as conductive plug structures. In some embodiments, the conductive plugs P1 includes conductive plug(s) P1a disposed within the pixel region R1 and conductive plug(s) P1b disposed in the periphery region R2. The conductive caps P2 includes conductive cap(s) P2a disposed in the pixel region R1 and conductive cap(s) P2b disposed in the periphery region R2.

Referring to FIG. 1A, FIG. 1B, and FIG. 3A, the conductive plugs P1a and the conductive plugs P1b are electrically coupled to the well regions 102a and 102b, respectively. The conductive plugs P1a in the pixel region R1 may be interconnected and may continuously extend around the photodetectors PD. The conductive plugs P1b in the periphery region R2 are physically spaced apart from the conductive plugs P1a in the pixel region R1. The conductive caps P2a and P2b are disposed over the conductive plugs P1a and P1b, respectively, and are physically and electrically connected to each other, such that the conductive plugs P1a and P1b are electrically connected to each other through the conductive caps P2a and P2b. In other words, the conductive cap P2 continuously extends from the pixel region R1, across the boundary region, and extend to the periphery region R2, so as to electrically connect the conductive plugs P1a to the conductive plugs P1b.

In some embodiments, the conductive plugs P1a, portions of the dielectric layer 116 and the spacer layer 117 on sidewalls of the conductive plugs P1a, and the well regions 102a are used for isolating the plurality of photodetectors PD from each other, and may also be referred to as an isolation structure IS. The well regions 102a may also be referred to as a first isolation structure or a front side isolation structure IS1. The conductive plugs P1a and portions of the dielectric layer 116 and the spacer layer 117 on sidewalls of the conductive plugs P1a may be referred to as a second isolation structure or a back side isolation structure IS2, such as a back side trench isolation (BTI) structure or a back side deep trench isolation (BDTI) structure. The front side isolation structure IS1 and the back side isolation structure IS2 respectively extend from the front side and the back side of the substrate 100 and meet with each other at a position in the substrate 100. In some embodiments, the back side isolation structure IS2 further extends into the front side isolation structure IS1 and may be partially embedded in and surrounded by the front side isolation structure IS1. The height (or depth) of the back side isolation structure IS2 defined from the back surface of the substrate 100 to a bottom surface of the back side isolation structure IS2 may be larger than, the same as, or less than the height (or depth) of the front side isolation structure IS1 defined from the front surface of the substrate 100 to a top surface of the front side isolation structure IS1. For example, the thickness of the substrate 100 may range from 1 μm to 10 μm, the height (or depth) of front side isolation structure IS1 may range from 0.5 μm to 9 μm, and/or the height (or depth) of the back side isolation structure IS2 may range from 0.5 μm to 9 μm.

In some embodiments, within the periphery region R2, the conductive plugs P1b, portions of the dielectric layer 116 and the spacer layer 117 on sidewalls of the conductive plugs P1b, and the well regions 102b and 103 may also be referred to a (conductive) plug structure CP or a (conductive) via structure, which is configured for electrically connecting the isolation structure IS in the pixel region R1 to the contact 108a through the conductive caps P2. The well regions 102b and 103 may also be referred to as a first plug (via) structure or a front side plug (via) structure CP1. The conductive plugs P1b and portions of the dielectric layer 116 and the spacer layer 117 on sidewalls of conductive plugs P1b may be referred to as a second plug (via) structure or a back side plug (via) structure CP2. The front-side via structure CP1 and the back side via structure CP2 respectively extend from the front side and the back side of the substrate 100 and meet with each other at a position in the substrate 100. The back side via structure CP2 may further extend into the front side via structure CP1 and may be partially embedded in and surrounded by the front side via structure CP1. In the embodiments, the isolation structure IS and the conductive plug structure CP have similar structures, except that the conductive plug structure CP includes the heavily doped region 103 for landing the conductive contact 108a, while the isolation structure IS may be free of heavily doped regions.

Still referring to FIG. 1A, FIG. 1B and FIG. 3A, in some embodiments, within the pixel region R1, the isolation structure IS may be configured as a grid or a mesh shape and may continuously extend around the plurality of photodetectors PD to separate the photodetectors PD from each other. Herein, the term "grid" refers to a structure including a network of lines/strips (or the like) that cross each other to form a series of interconnected ring-shaped units, and the ring-shaped units may have a square ring-shape, a rectangular ring-shape, a circular ring-shape, an oval ring-shape, or the like. In other words, the isolation structure IS includes a series of interconnected ring-shaped units, and the ring-shaped units laterally surround corresponding photodetectors PD. In some embodiments, both the front side isolation structure IS1 and the back side isolation structure IS2 are configured as a grid or a mesh shape and may have substantially the same or different sizes (e.g., widths). The sidewalls of the front side isolation structure IS1 and the back side isolation structure IS2 may be substantially aligned with or laterally shifted from each other. The orthographic projection of the back side isolation structure IS2 on the front surface 100f of the substrate 100 may be substantially completely within or partially within the orthographic projection of the front side isolation structure IS1 on the front surface 100f of the substrate 100. It is noted that, for the sake of brevity, some components (e.g., the dielectric layer 116, the spacer layer 117, and the doped regions 102/103) are not specifically shown in the top view.

The conductive cap P2a is disposed on the back side isolation structure IS2 of the isolation structure IS. In some embodiments, the conductive cap P2a is also configured as a grid or mesh shape and may also be referred to as a conductive grid. In some embodiments, the conductive cap P2a may be substantially aligned with or laterally shifted from the back side isolation structure IS2 of the isolation structure IS and may have substantially the same or different sizes (e.g., widths, lengths, etc.). In other words, the centers of the ring-shaped units of the back side isolation structure IS2 (or the isolation structure IS) may be substantially aligned with or laterally shift from the centers of the ring-shaped units of the conductive cap P2a in a direction perpendicular to the front or back surface of the substrate 100. The orthographic projection of the back side isolation structure IS2 on the front surface 100f of the substrate 100 may be substantially within the orthographic projection of the conductive cap P2a on the front surface 100f of the substrate 100, or vice versa. Alternatively or additionally, the orthographic projection of the back side isolation structure IS2 on the front surface 100f of the substrate 100 may be partially overlapped with the orthographic projection of the conductive cap P2a on the front surface 100f of the substrate 100.

Figure 4:
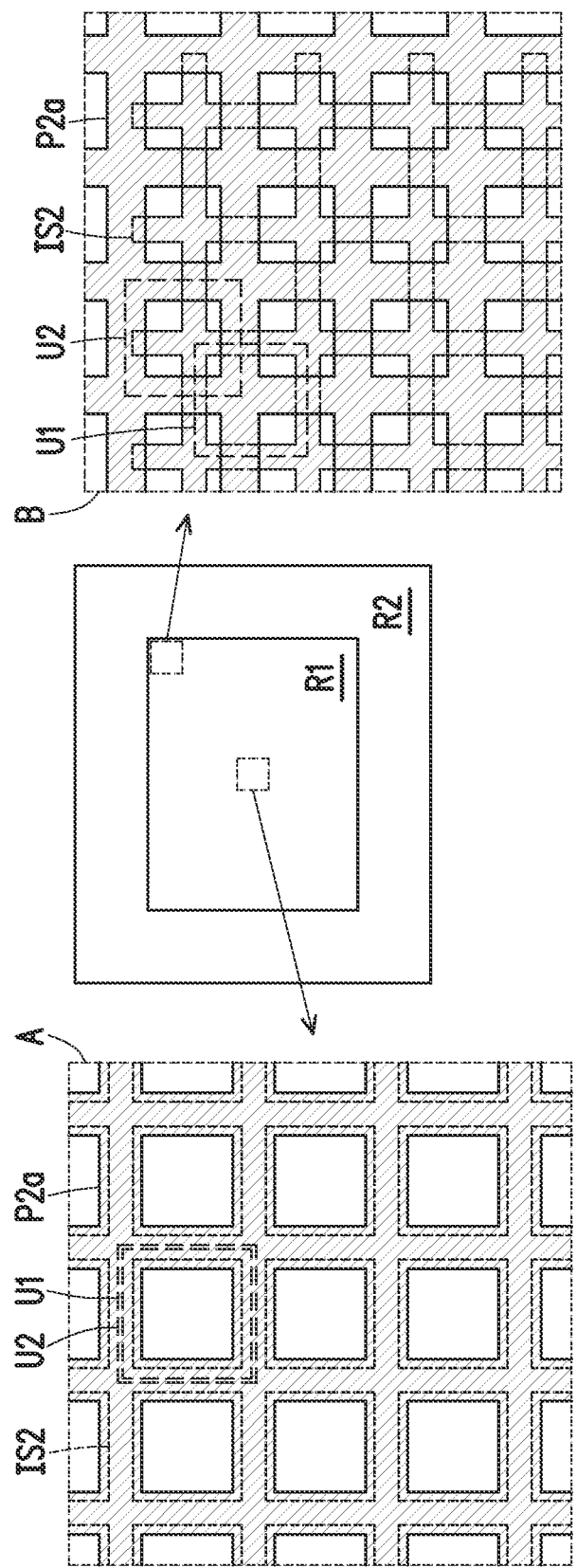
FIG. 4 schematically illustrates a layout of a back side isolation structure and a conductive cap of a semiconductor device according to some embodiments of the disclosure.

FIG. 4 schematically illustrates a layout of the back side isolation structure IS2 and the conductive cap P2a according to some embodiments of the disclosure. The enlarged views A and B illustrate the layouts of the back side isolation structure IS2 and the conductive cap P2a in a center portion and an edge portion of the pixel region R1, respectively. As shown in FIG. 4, the conductive cap P2a overlays the back side isolation structure IS2. The grid-shaped back side isolation structure IS2 includes a plurality of ring-shaped units U1, and the grid-shaped conductive cap P2a includes a plurality of ring-shaped units U2. In some embodiments, the position relationship between the back side isolation structure IS2 and the conductive cap P2a in different positions of the pixel region R1 may be different. For example, as shown in the enlarged view A, at the center portion of the pixel region R1, the conductive cap P2a is substantially aligned with the back side isolation structure IS2, such that the ring-shaped units U2 of the conductive cap P2a and the ring-shaped units of the back side isolation structure IS2 may be substantially concentric. On the other hand, as shown in the enlarged view B, at the edge portion of the pixel region R2, the conductive cap P2a may be laterally shifted from the back side isolation structure IS2, such that the centers of the ring-shape units U2 of the conductive cap P2a may be laterally shift from the centers of the ring-shaped units U1 of the back side isolation structure IS2. It is noted that, the layout of the conductive cap P2a and the back side isolation structure IS2 shown in FIG. 4 is merely for illustration, and the disclosure is not limited thereto. The layout of the conductive cap P2a and the back side isolation structure IS2 may be adjusted based on product design.

Referring back to FIG. 1A, FIG. 1B and FIG. 3A, the conductive cap P2b extends from adjoining the conductive cap P2a within the pixel region R1 to the periphery region R2. In some embodiments, the conductive cap P2b may also be referred to as an extension part of the conductive cap P2a. FIG. 3A to FIG. 3D illustrate various configurations of the conductive cap P2b and the conductive plug structure CP according to some embodiments of the disclosure.

Figure 3B:
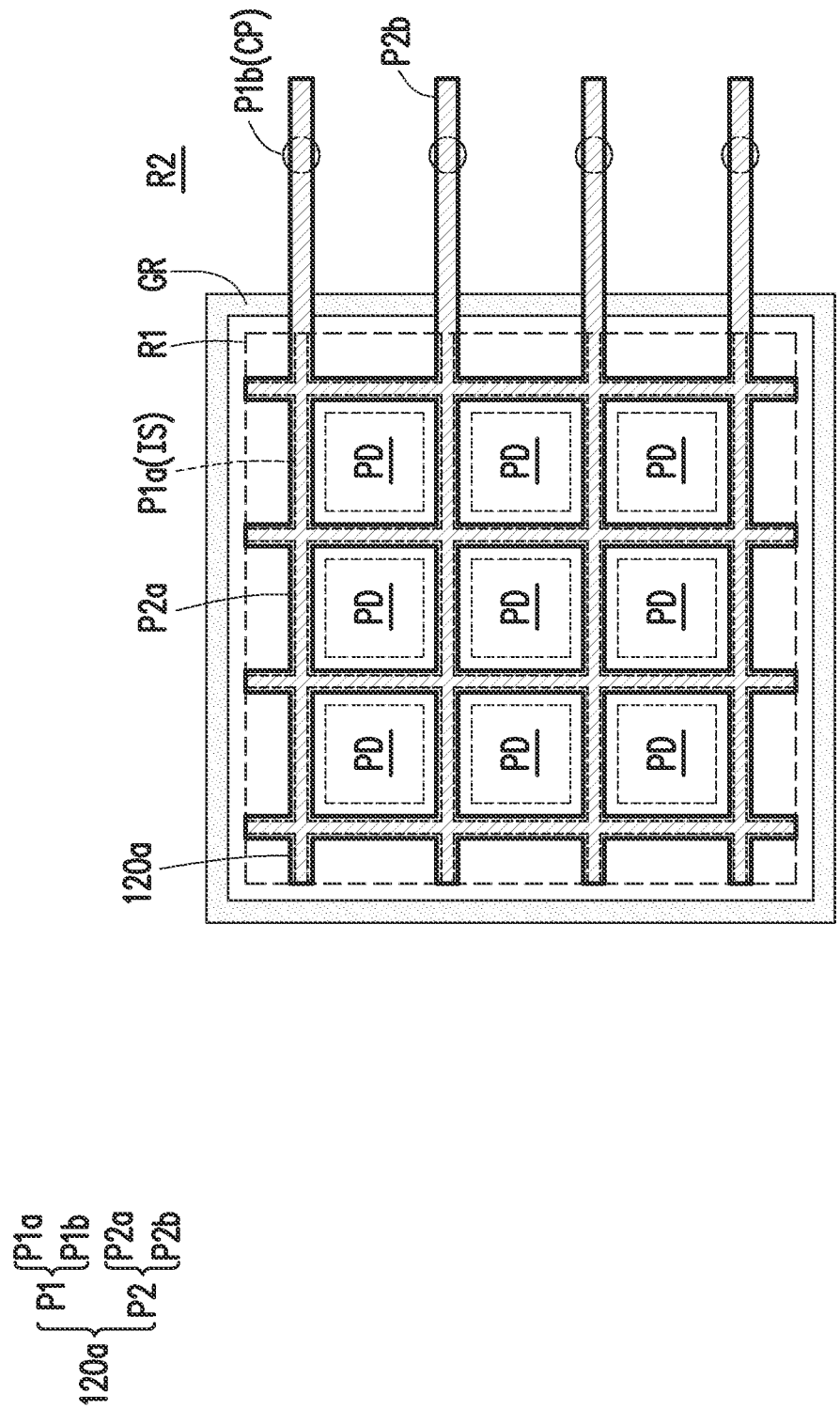
Figure 3C:
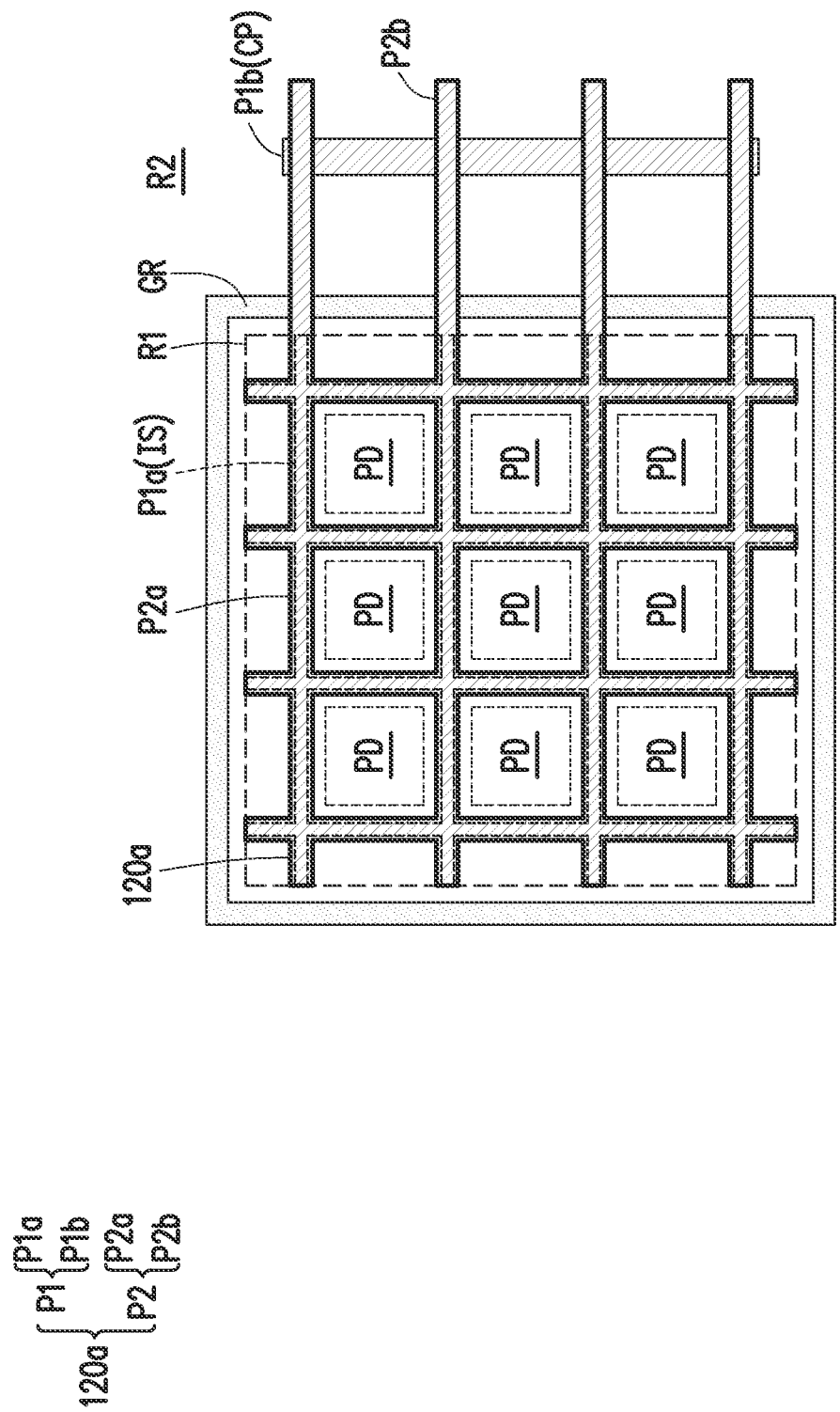
Figure 3D:
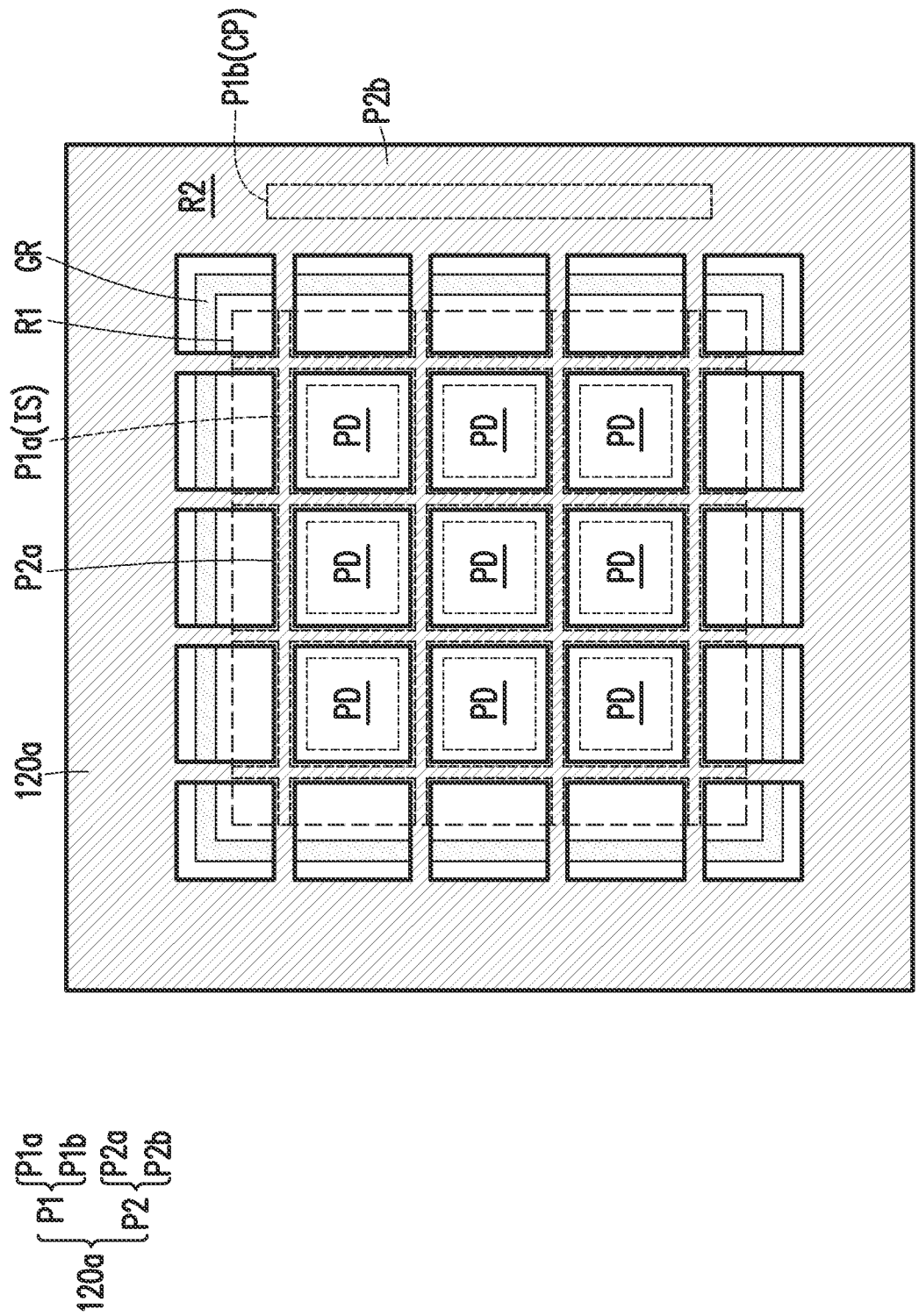

In some embodiments, as shown in FIG. 3A to FIG. 3C, at least one of the segments of the conductive grid P2a extend to the periphery region R1 along the lengthwise direction thereof, so as to form the conductive cap P2b. The conductive cap P2b may include one or more conductive strips connected to the conductive grid P2a. However, the disclosure is not limited thereto. In some other embodiments, the conductive cap P2b may include one or more metal plates. For example, as shown in FIG. 3D, the conductive cap P2b includes a ring-shaped metal plate laterally surrounding the conductive grid P2a. Alternatively, in the embodiments in which the conductive cap P2b includes one or more conductive strips connected to the conductive grid P2a, one or more additional metal plates may be further disposed on the conductive strips. In such embodiments, the metal plate(s) may be configured to block the periphery region R2 from incident irradiation from the back side of the semiconductor device 500A, thereby protecting devices (e.g., logic devices) in the periphery region R2 from being damaged by the incident irradiation. The metal plate(s) may or may not cover the boundary region between the pixel region R1 and the periphery region R2.

In some embodiments, the conductive plug structure CP is disposed underlying and electrically connected to the conductive cap P2b. The conductive plug structure CP may be configured as a ring-shaped structure laterally surrounding the isolation structure IS and electrically connected to the metal strips of the conductive cap P1b, as shown in FIG. 3A. In such embodiments, the conductive plug structure CP may also be referred to as a conductive ring. The conductive ring may be a continuous ring, or a non-continuous ring (not shown) including a plurality of segments spaced apart from each other.

In some alternative embodiments, the conductive plug structure CP may include a plurality of via structures spaced apart from each other and respectively connected to the corresponding metal strips of the conductive cap P2b, as shown in FIG. 3B. The top view of the via structure may be circular, oval, square, rectangle, or the like, or any other suitable shape. In yet another embodiment, the conductive plug structure CP may include one or more conductive strips electrically connected to the conductive cap P2b, as shown in FIG. 3C. In view of above, when viewed in a top view, the conducive plug structure(s) CP, including the backside plug structure(s) CP2, may be configured as one or more rings, one or more vias, one or more strips, or the like, or combinations thereof. It is noted that, the configurations, shapes, and sizes of the conductive plug structure CP and the conductive cap P2b shown in FIGS. 3A to FIG. 3D are merely for illustration, and the disclosure is not limited thereto. The conductive plug structure CP and the conductive cap P2b may have any suitable configurations, shapes, and/or sizes, based on product design, as long as the conductive plug structure CP is electrically connected to the conductive cap P2 and the conductive contact 108a.

Referring to FIG. 1A and FIG. 1B, in some embodiments, one or more conductive contacts 108a is/are disposed in the periphery region R2 to be electrically connected to the conductive plug structure CP. The conductive contact 108a may land on the heavily doped region 103 and is electrically connected to the isolation structure IS through the doped regions 103, 102b, the backside plug structure CP2 of the conductive plug structure CP, and the conductive cap P2. In some embodiments, the conductive contact 108a is not disposed within the pixel region R1. In other words, the pixel region R1 may be free of conductive contacts directly landing on the well regions 102a of the isolation structure IS within the pixel region R1. However, the disclosure is not limited thereto.

The conductive contact 108a may be configured for providing a ground voltage or a negative bias to the isolation structure IS. In some embodiments, the conductive contact 108a is configured to provide electrical connection between the conductive plug structure CP, the conductive cap P2, the isolation structure IS and ground. For example, a ground voltage (e.g., about 0 Volt (V)) may be applied to the isolation structure IS through the conductive contact 108a, the conductive plug structure CP and the conductive cap P2, such that the isolation structure IS is grounded. In some embodiments, a negative bias (also referred to as an isolation bias) may be applied to the isolation structure IS through the conductive contact 108a, the conductive plug structure CP and the conductive cap P2. The negative bias may generate hole accumulations along sidewalls of the isolation structure IS, thereby providing better isolation for the photodetectors, and thus improving the performance of the image sensor.

Referring back to FIG. 1A, in some embodiments, a hard mask 122a is optionally disposed on the conductive cap P2. The hard mask 122a has substantially the same pattern (e.g., a grid pattern) as the conductive cap P2. In some embodiments, the combination of the conductive cap P2a and a portion of the hard mask 122a in the pixel region R1 may also be referred to as a grid structure. A dielectric liner 126 may be disposed on the conductive cap P2 and lining the top surface and sidewalls of the conductive cap P2 and the top surface of the dielectric layer 118a. The dielectric liner 126 may also be referred to as a dielectric liner or a dielectric spacer layer. In some embodiments, a dielectric layer 127 may be disposed on the dielectric liner 126 and filling the openings of the grid structure including the conductive cap P2 and the hard mask 122a.

A plurality of light filters (e.g., color filters) 128 and lenses (e.g., micro-lenses) 130 are disposed over the grid structure and the dielectric layer 127 within the pixel region R1. In some embodiments, the light filters 128 and lenses 130 may each correspond to one or more photodetectors PD. The light filters 128 are respectively configured to transmit specific wavelengths of incident light. The lenses 130 are disposed over the light filters 128, and are configured to focus the incident light towards the photodetectors PD, for example.

FIG. 2A to FIG. 2H illustrate cross-sectional views of semiconductor devices 500B-500I according to some other embodiments of the disclosure. The semiconductor devices 500B-500I are similar to the semiconductor device 500A, except for the differences described in detail below.

Figure 2A:
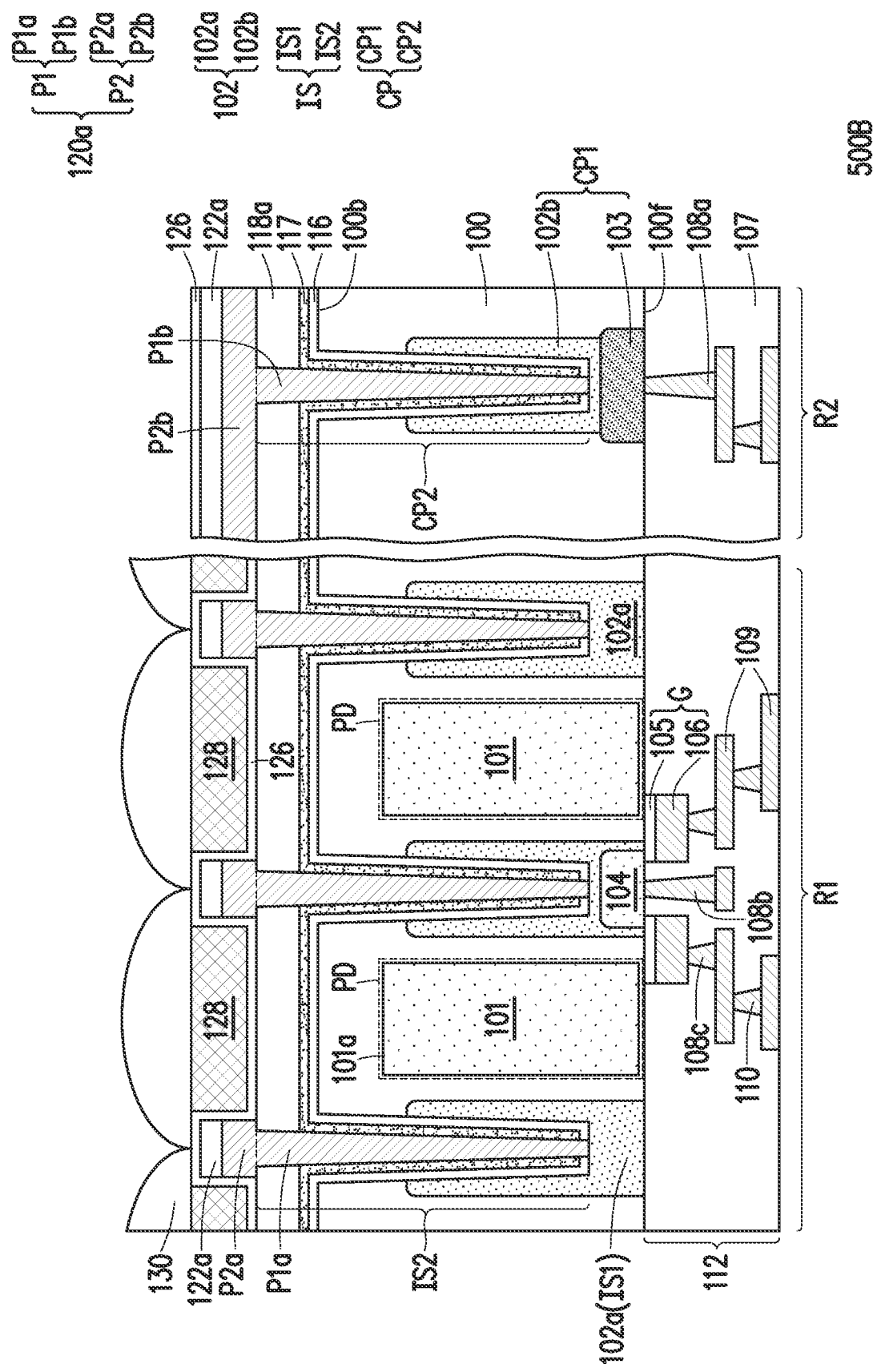
FIG. 2A to FIG. 2H are schematic cross-sectional views illustrating semiconductor devices according to some other embodiments of the disclosure.

Referring to FIG. 2A, in some embodiments, the dielectric layer 127 of the semiconductor device 500A (FIG. 1A) may be omitted, and the light filters 128 may be disposed in the openings of the grid structure including the conductive cap P2 and/or the hard mask 122a.

Figure 2B:
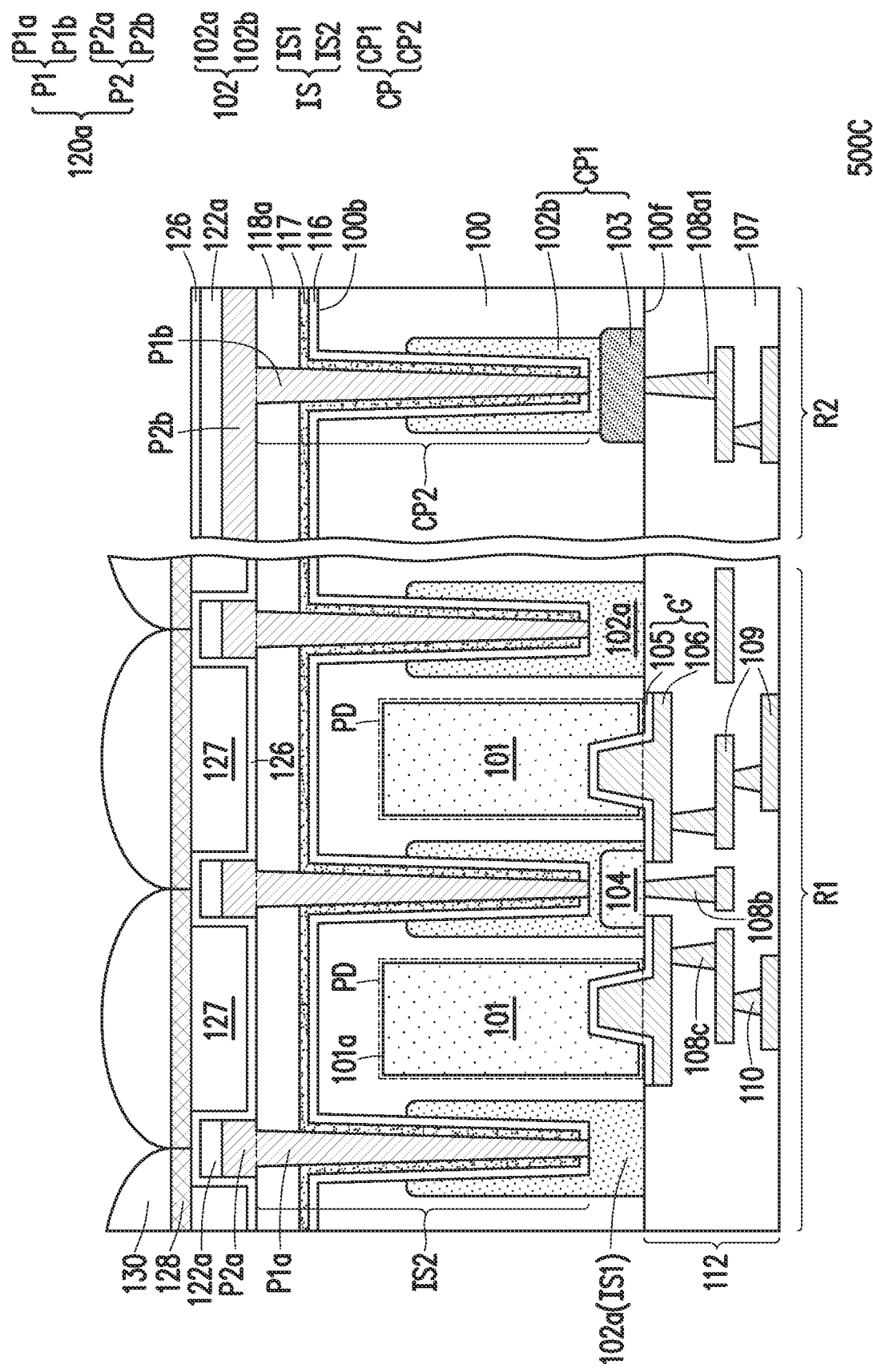

Referring to FIG. 2B, in some embodiments, the semiconductor device 500C includes a transfer gate G' that is partially embedded in the corresponding photodetector PD. The transfer gate G' is overlapped with and coupled to the photodetector PD and the doped region 104. The transfer gate G' further extends into the photodetector PD and has an extending portion that is embedded in and laterally surrounded by the photodetector PD. As such, the coupling area between the transfer gate G' and the photodetector PD is increased, thereby increasing the efficiency of transferring charges from the photodetector PD to the doped region 104.

Figure 2C:
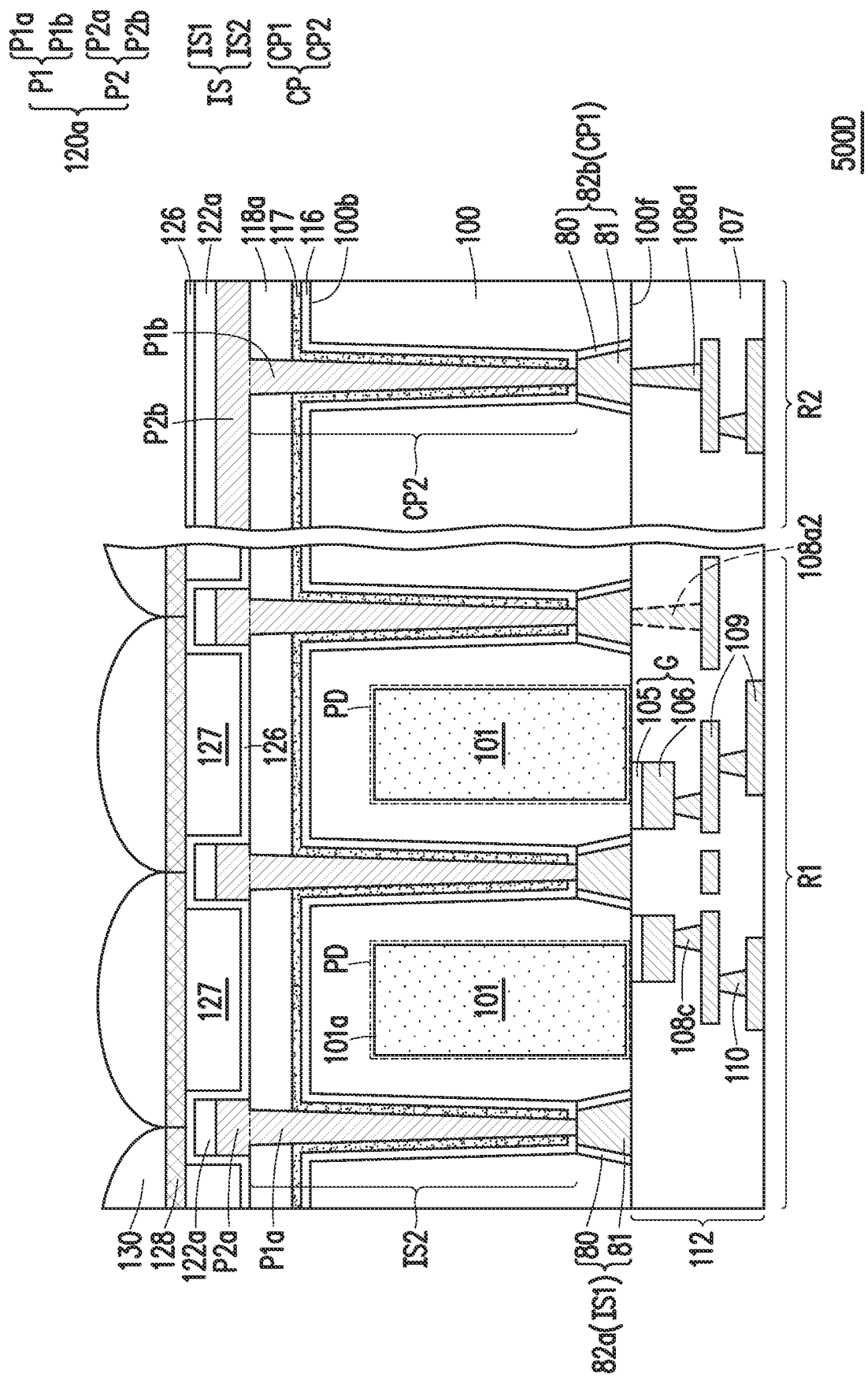

Referring to FIG. 2C, in some embodiments, the front side isolation structure IS1 and the front side plug structure CP1 may respectively be or include a trench structure (e.g., a shallow trench structure) 82a and 82b, and the well regions 102 (FIG. 1A) may be omitted. The shallow trench structures 82a/82b extend from the front surface 100f of the substrate 100 to a positon in the substrate 100 and are electrically connected to the conductive plugs P1. In such embodiments, the front side isolation structure IS1 may also be referred to as a shallow trench isolation (STI) structure. The shallow trench structures 82a/82b may include a conductive layer 81 and a dielectric liner 80 disposed between the conductive layer 81 and the substrate 100. In some embodiments, the conductive plugs P1 penetrate through the dielectric liner 80 to be electrically connected to the conductive layer 81. The dielectric liner 80 may include any suitable dielectric material, such as silicon oxide, silicon nitride, silicon oxynitride, the like, or combinations thereof. In some embodiments, the conductive layer 81 may include polysilicon layer, such as a doped polysilicon layer. For example, the doped polysilicon layer may include dopants (e.g., boron) having the second doping type (e.g., p type). However, the disclosure is not limited thereto. In some alternative embodiments, the conductive layer 81 may include other suitable conductive materials, such as metal, metal alloy, or the like. For example, the conductive layer 81 may include tungsten, copper, AlCu, Al. The conductive layer 81 may include a conductive material the same as or different from that of the conductive structure 120a. It is noted that, for the sake of brevity, the doped region 104 (FIG. 1A) is not shown in FIG. 2C.

In some embodiments, within the periphery region R2, a conductive contact 108a1 lands on the conductive layer 81 of the front side conductive plug structure CP1 to provide a ground voltage or a negative bias to the isolation structures IS. In some embodiments, the pixel region R1 may be free of a conductive contact landing on the conductive layer 81 of the front side isolation structure IS1. However, the disclosure is not limited thereto. In some alternative embodiments, one or more conductive contacts 108a2 may be optionally disposed within the pixel region R1 and may land on the conductive layer 81 of the isolation structure IS1, so as to additionally provide a ground voltage or a negative bias to the isolation structure IS1. In such embodiments, the electrical conducting path between the applied bias and the isolation structure IS is shortened.

Figure 2D:
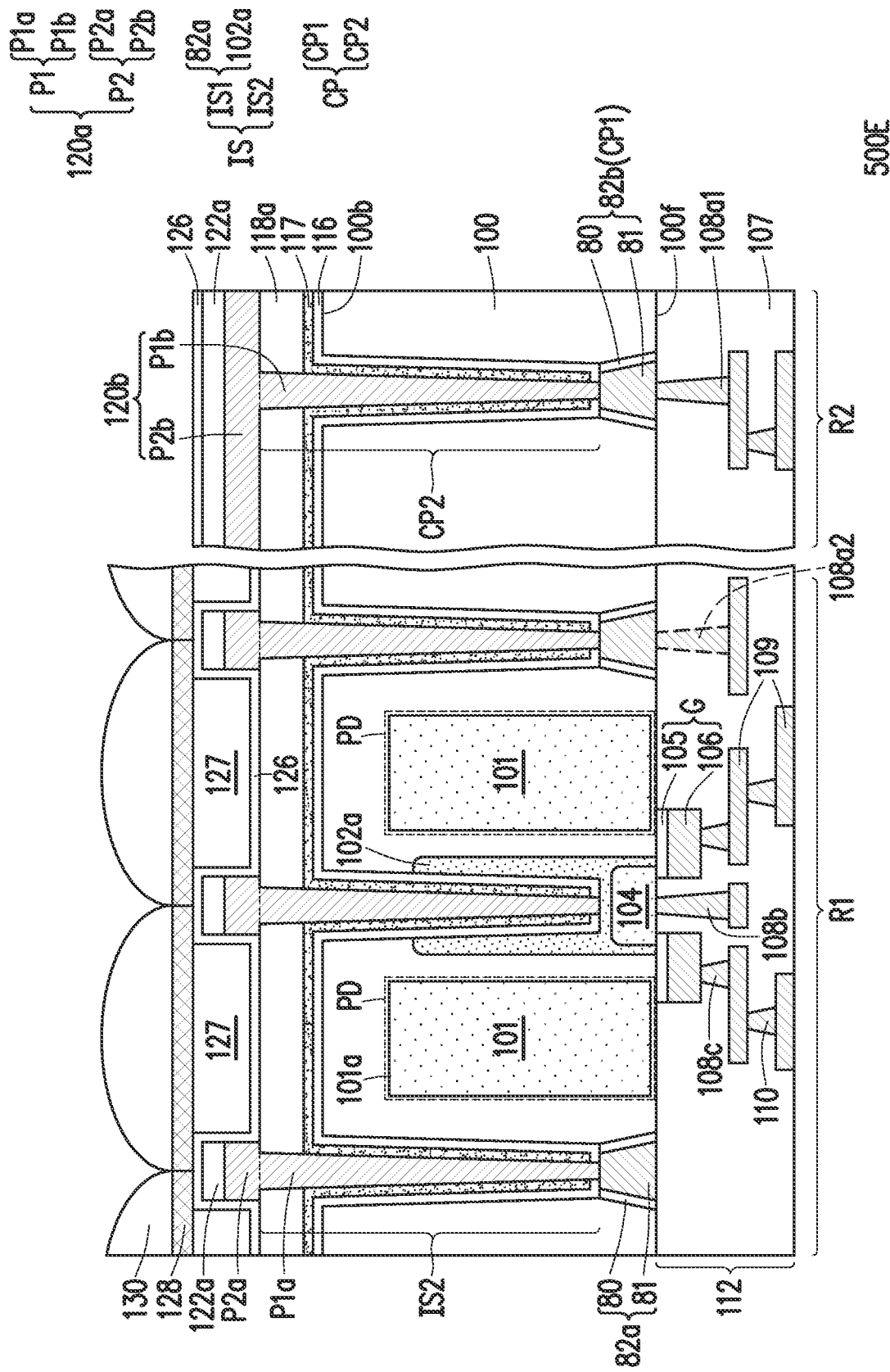

Referring to FIG. 2D, in some embodiment, the front side isolation structure IS1 may include a combination of the STI structure 82a and the well region 102a. For example, a portion of the front side isolation structure IS1 includes the well region 102a, while another portion of the front side isolation structure IS includes the STI structure 82a. The STI structure 82a and the well region 102a may be disposed as side by side and connected to each other, so as to constitute a continuous front side isolation structure IS1.

Figure 2E:
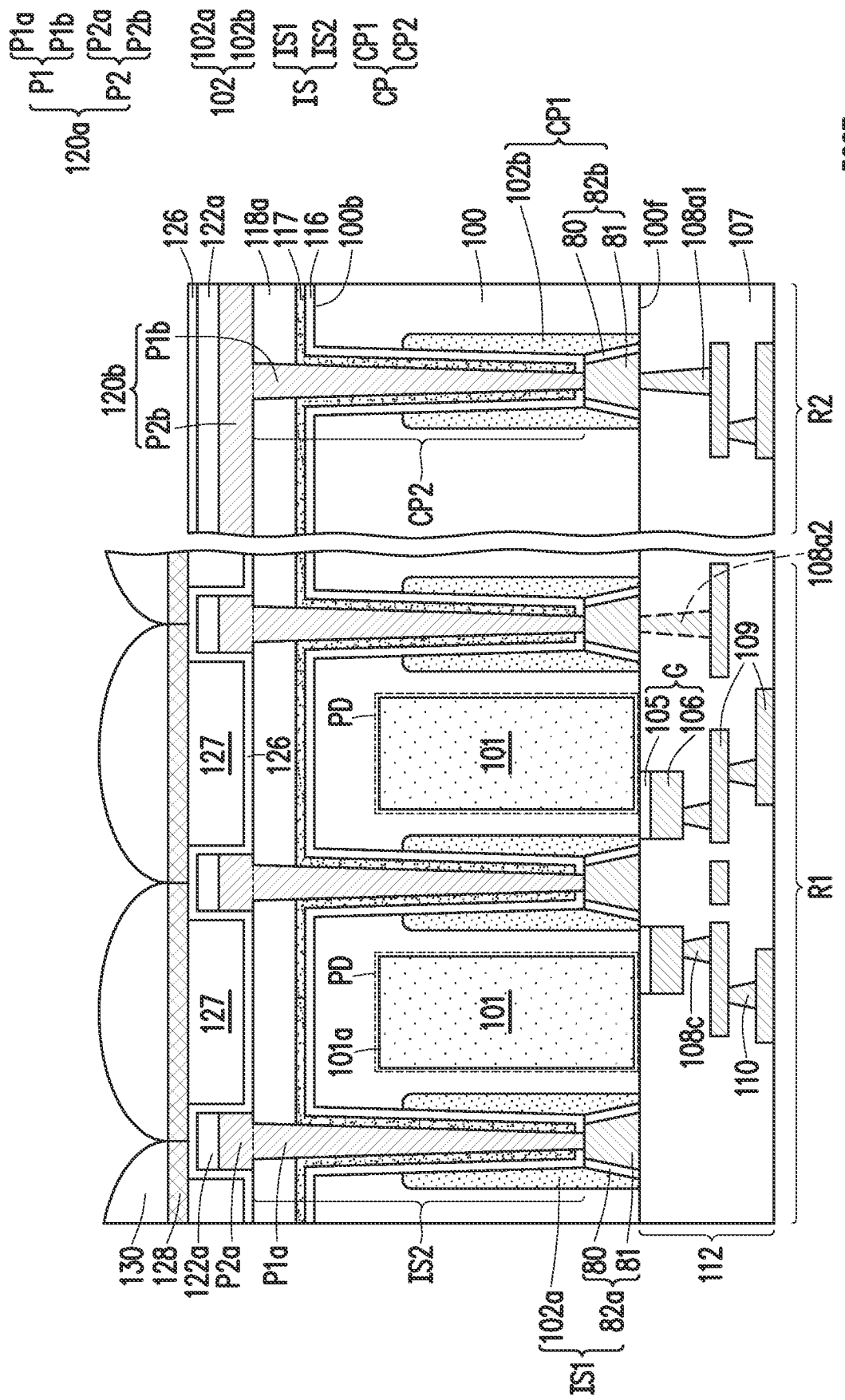

FIG. 2E illustrates a semiconductor device 500F including a front side isolation structure IS1 which is constituted by a combination of the STI structure 82a and the well region 102a according to alternative embodiments of the disclosure. In some embodiments, one or both of the shallow trench structures 82a and 82b may be optionally disposed in the well regions 102a and 102b. In some embodiments, the STI structure 82a may be disposed within and laterally surrounded by the well region 102a. The STI structure 82a and the well region 102a are overlapped with each other in a direction perpendicular to the front surface 100f of the substrate 100. The back side isolation structure IS2 may penetrate through the well region 102a and the dielectric liner 80 to land on and electrically connect to the conductive layer 81. Similarly, the trench structure 82b may be optionally disposed within a well region 102b, and the structural feature of the conductive plug structure CP is substantially similar to that of the isolation structure IS.

Figure 2F:
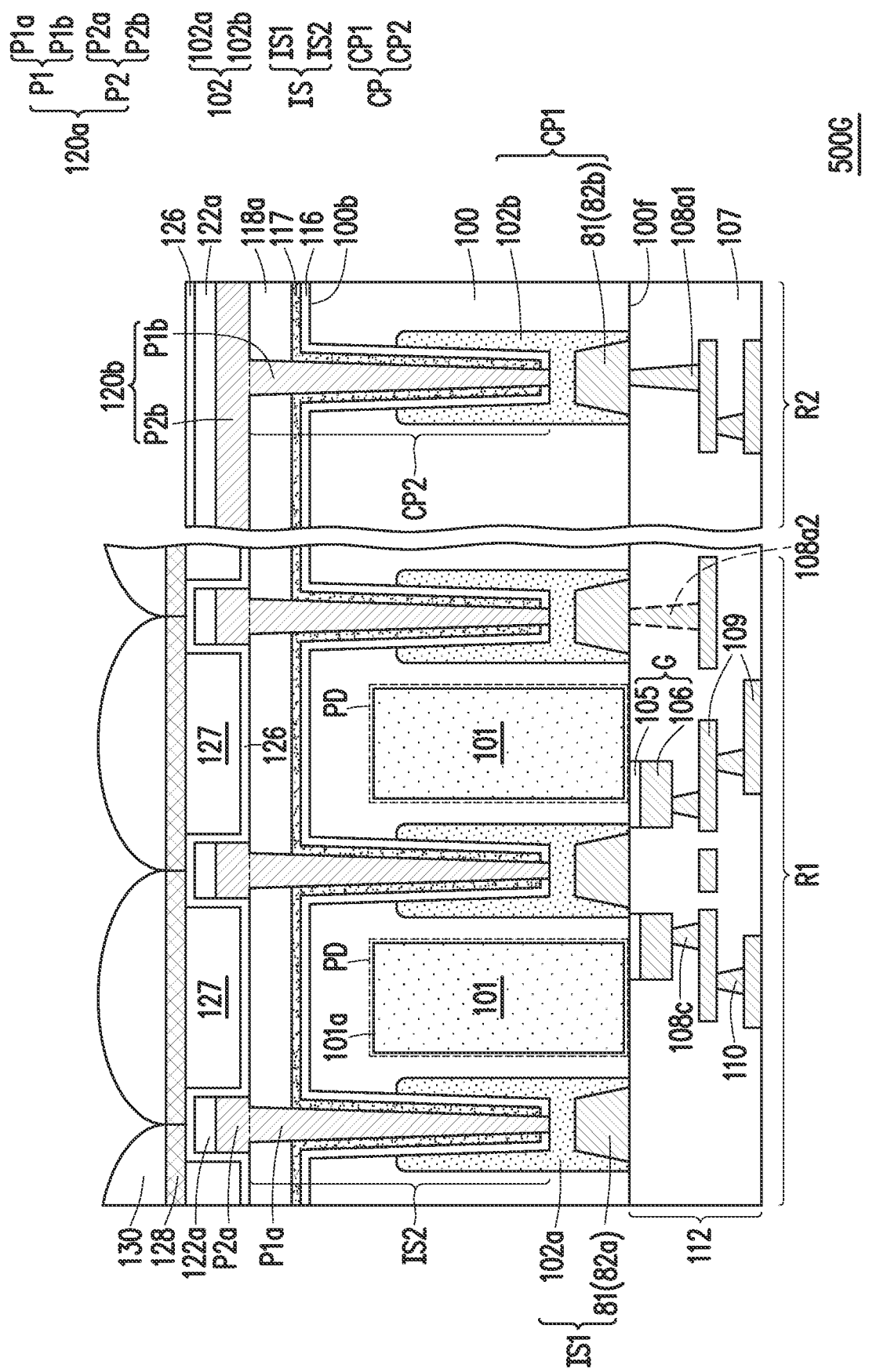

FIG. 2F illustrates a semiconductor device 500G which is similar to the semiconductor device 500F (FIG. 2E), except that the back side isolation structure IS2 and/or the back side conductive plug structure CP2 land on the corresponding well regions 102a/102b. Referring to FIG. 2F, in some embodiments, the shallow trench structure 82a/82b includes the conductive layer 81 and may be free of a dielectric liner. The sidewalls of the conductive layer 81 are in physical contact and coupled to the well regions 102. In such embodiments, the back side isolation structure IS2 and back side plug structure CP2 may land on and electrically couple to the well regions 102a and 102b, and may further electrically couple to the conductive layers 81 through the well regions 102a and 102b, respectively. It should be understood that in the embodiments in which the shallow trench structure 82 is free of a dielectric liner, the back side isolation structure IS2 and the back side plug structure CP2 may also penetrate through the well regions 102a and 102b to land on the conductive layers 81.

Figure 2G:
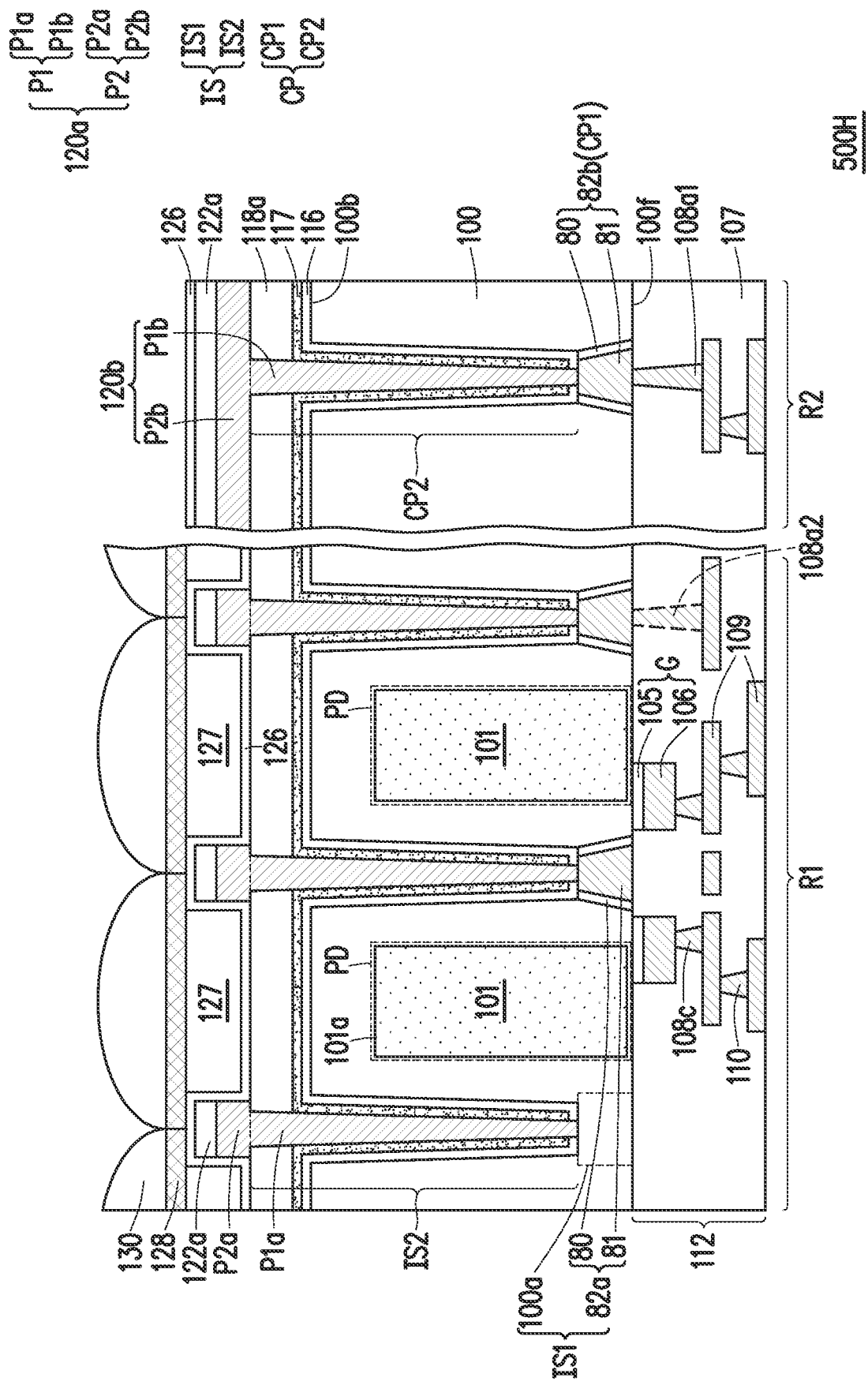

FIG. 2G illustrates a semiconductor device 500H according to some other embodiments of the disclosure. The semiconductor device 500H is similar to the semiconductor device 500D (FIG. 2D), except that a portion of the STI structure 82a may be omitted. In some embodiments, the substrate 100 is a substrate having the second doping type, such as a p-type substrate. In such embodiments, a portion 100a of the substrate 100 may serve as at least a portion of the front side isolation structure IS1 and may electrically couple to the back side isolation structure IS2, while a portion of or the entire STI structure 82a in the pixel region R1 may be omitted. In other words, the isolation structure IS1 may include a portion 100a of the substrate 100 and/or the STI structure 82a.

Figure 2H:
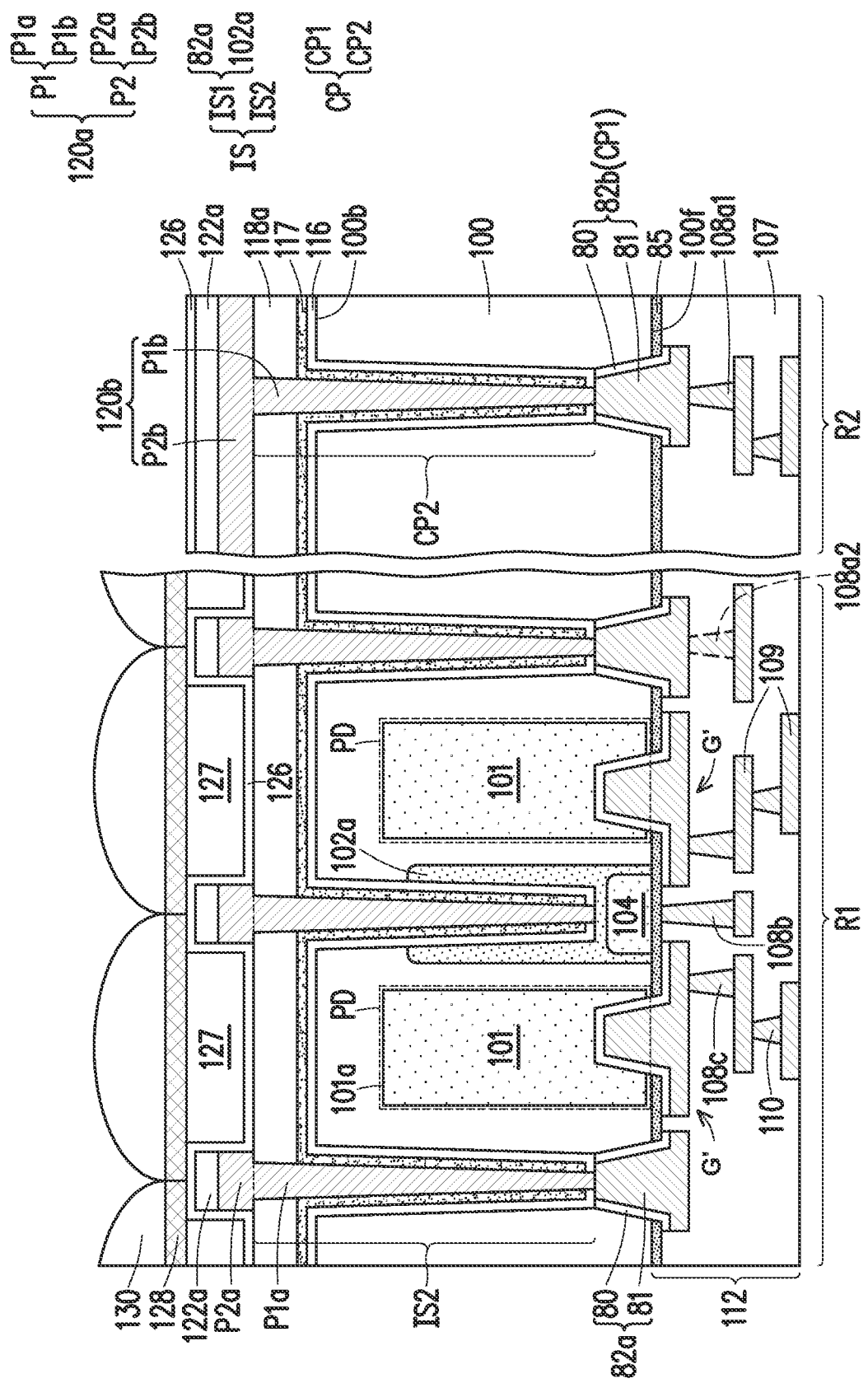

FIG. 2H illustrates a semiconductor device 500I according to yet another embodiment of the disclosure. In some embodiments, the transfer gates G' extend into the photodetectors PD and protrude from the front surface 100f of the substrate 100. The shallow trench structures 82a/82b are embedded in the substrate 100 and may further protrude from the front surface 100f of the substrate 100. In some embodiments, the surfaces of the transfer gates G' contacting the conductive contact 108c and the surfaces of the shallow trench structure 82a/82b contacting the conductive contact 108a1/108a2 may be substantially coplanar/level with each other or at different level heights. The transfer gates G' and the shallow trench structure 82a/82b may include substantially the same materials or different materials and may be formed simultaneously or sequentially. In some embodiments, a pad layer 85 may be disposed on the front surface 100f of the substrate 100. The pad layer 85 may include an oxide, such as silicon oxide, and may also be referred to as a pad oxide layer. In some embodiments, the transfer gates G' and the shallow trench structure 82 penetrate through the pad oxide layer 85 and protrude from the surface of the pad oxide layer 85 facing the dielectric structure 107.

FIG. 5A to FIG. 14 are cross-sectional views illustrating a method of forming a semiconductor device according to some embodiments of the disclosure.

Figure 5A:
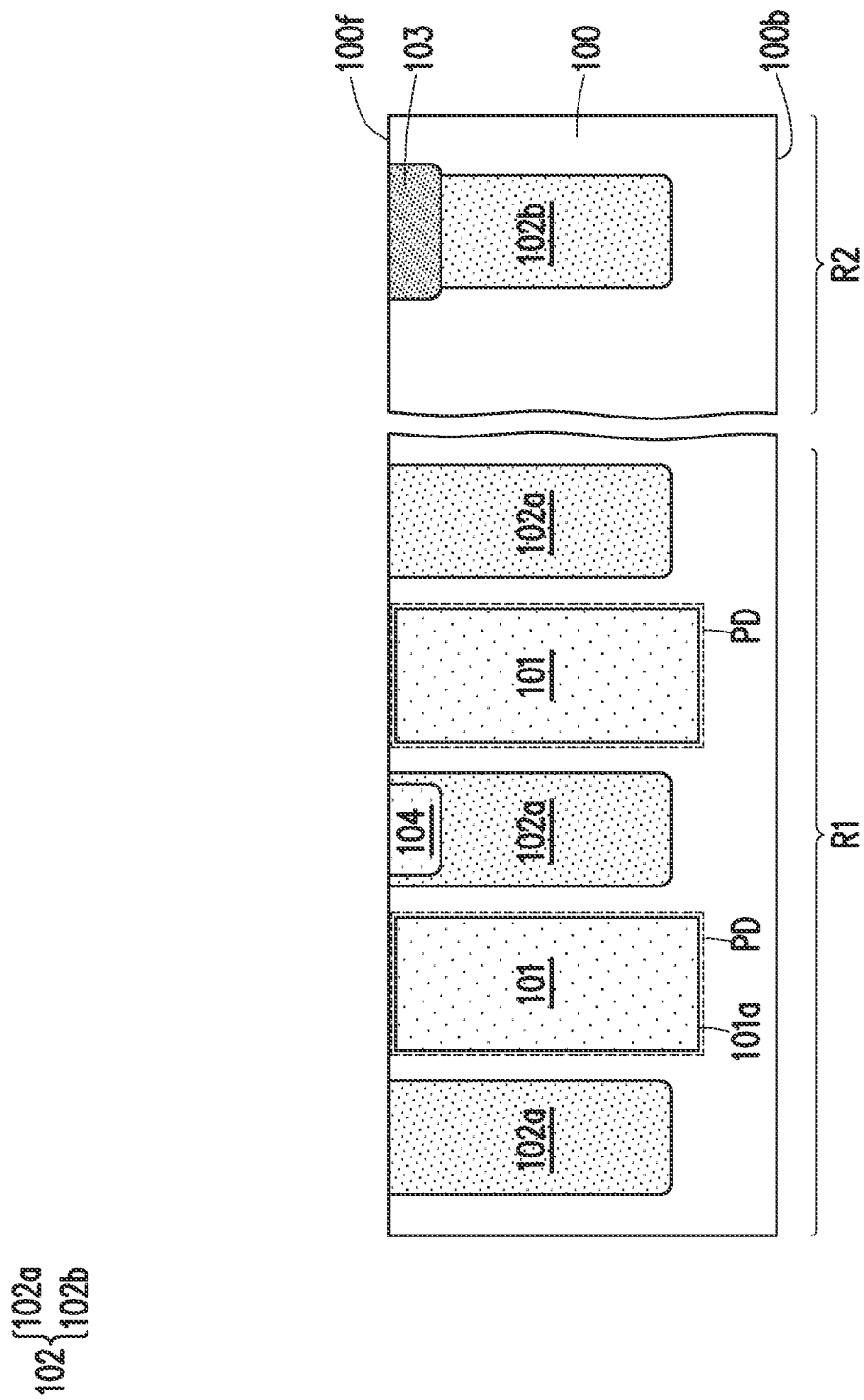

Referring to FIG. 5A, a substrate 100 is provided. In some embodiments, the substrate 100 is a semiconductor substrate, such as a bulk semiconductor substrate, a semiconductor-on-insulator (SOI) substrate, or the like, which may be doped (e.g., with a p-type or an n-type dopant) or undoped. The substrate 100 may be a wafer, such as a silicon wafer configured for forming an image sensor die. Other substrates, such as a multi-layered or gradient substrate may also be used. In some embodiments, the semiconductor material of the substrate 100 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AnnAs, AlGaAs, GaInAs, GaInP, and/or GaInAsP; or combinations thereof.

Depending on design, the substrate 100 may be a p-type substrate, an n-type substrate or a combination thereof and may have doped regions (e.g., an n-type well and/or a p-type well) therein. The substrate 100 may be configured for a complementary metal oxide semiconductor (CMOS) image sensor device. The substrate 100 has a front surface 100f and a back surface 100b opposite to the front surface 100f.

In some embodiments, the substrate 100 includes a first region R1 such as a pixel region and a second region R2 such as a periphery region. A plurality of photodetectors (e.g., photodiodes) PD are formed in the substrate 100 within the pixel region R1. The photodetectors PD may be arranged in an array including column(s) and/or row(s). In some embodiments, the photodetector PD may include a doped region 101 having a first doping type (e.g., n-type). In some embodiments, the photodetector PD further includes a doped region 101a adjoining the doped region 101 and having a second doping type (e.g., p-type) opposite to the first doping type. The doped region 101a may be a portion of the substrate 100 having the second doping type.

The formation of the photodetectors PD may include an implantation process. For example, a patterned mask layer is formed over the substrate 100, where the patterned mask layer has openings exposing portions of the substrate 100 at the intended locations of the doped regions 101. Thereafter, with the patterned mask layer disposed on the substrate 100, dopant species (e.g., phosphorus, arsenic, or a combination thereof) having the first doping type (e.g., n-type) are implanted into the substrate 100 to form the doped regions 101 of the photodetectors PD. In some embodiments, before forming the patterned mask layer, a pad layer (e.g., the pad oxide layer 105 shown in FIG. 2H) may be formed on the front surface 100f of the substrate 100, such that the front surface 100f would not be directly subjected to the ion bombardment of the implantation process, thereby protecting the front surface 100f from being damaged by the implantation process.

Still referring to FIG. 5A, a plurality of well regions 102 are formed in the substrate 100. The well regions 102 include well region 102a formed within the pixel region R1 and the well region 102b formed within the periphery region R2. The well regions 102 may include dopants (e.g., boron and/or $BF_2^+$) having a second doping type (e.g., p-type) opposite to the first doping type (e.g., n-type). The formation of the well regions 102 may include an implantation process which implants dopants having the second doping type into the substrate 100. In some embodiments, a doped region 103 having the second doping type (e.g., p-type) is formed on the well region 102b within the periphery region R2, by a further implantation process. The doping concentration of the doped region 103 is greater than the doping concentration of the well region 102b. In some embodiments, the doped region 103 may also be referred to as a heavily doped region, such as a p+ region. The width of the doped region 103 may be larger than that of the well region 102b, but the disclosure is not limited thereto. In some embodiments, the doped region 103 is not formed on the well regions 102a within the pixel region R1. In some embodiments, the well regions 102a in the pixel region R1 may be connected to each other and configured as a grid structure laterally surrounding and separating the photodetectors PD.

Still referring to FIG. 5A, in some embodiments, a doped region 104 is formed within the pixel region R1 of the substrate 100 and is disposed laterally aside or between the photodetectors PD. The doped region 104 may be formed by implanting doping species having the first doping type (e.g., n-type) into the substrate 100. In some embodiments, the doped region 104 may be disposed within the well region 102a.

In the embodiments, the implantation processes of the doped regions 101-104 are performed from the front side of the substrate 100, such that the doped regions 101-104 extend from the front side of the substrate to positions between the front surface 100f and the back surface 100b of the substrate 100. In some embodiments, the depth of the doped region 101 is larger than the depth of the well region 102s, but the disclosure is not limited thereto.

Figure 5B:
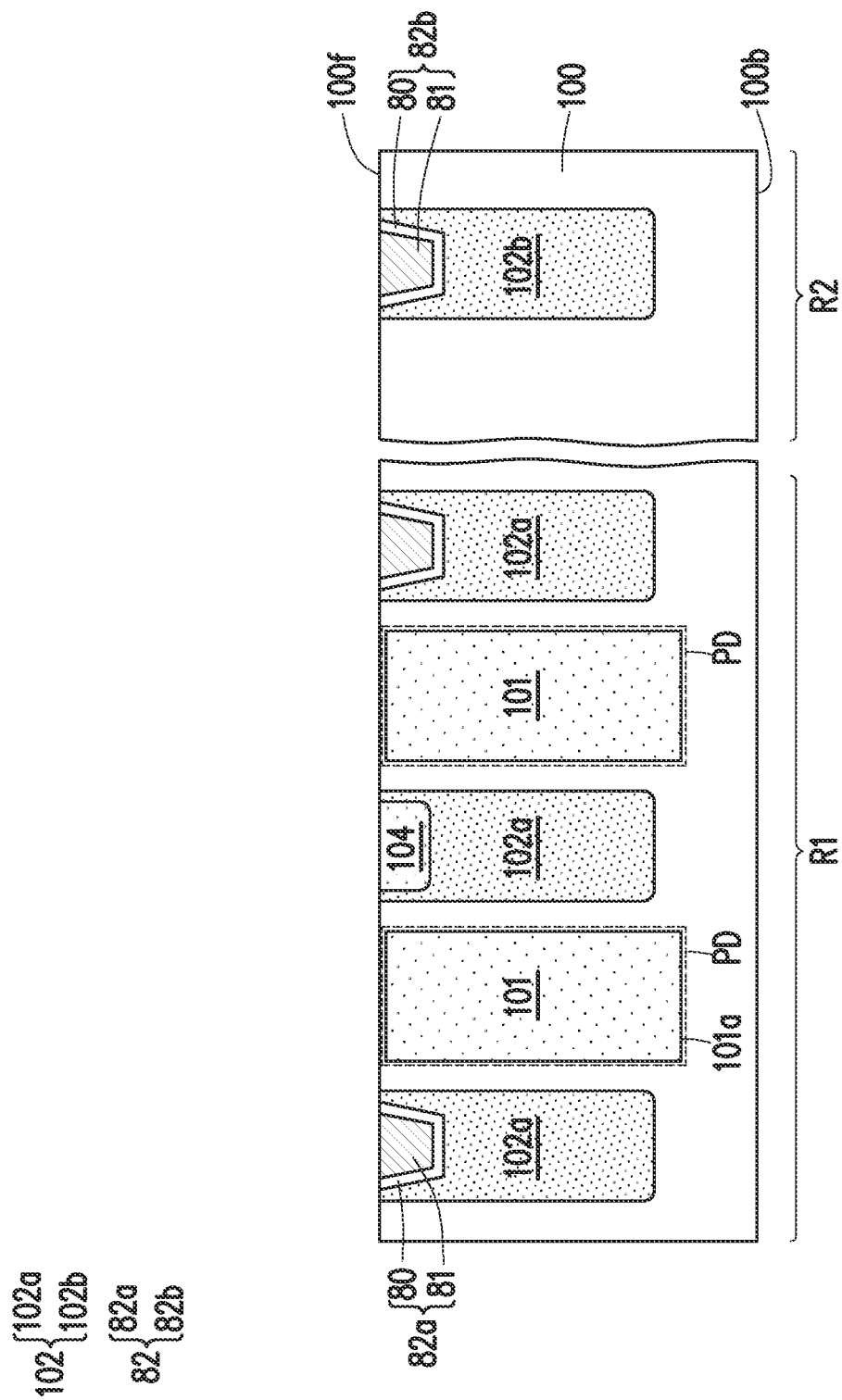

Referring to FIG. 5B, in some alternative embodiments, a plurality of trench (e.g., shallow trench) structures 82 may be formed in the substrate 100. The shallow trench structures 82 may be formed within the well regions 102. The shallow trench structure 82 may include shallow trench structures 82a formed in the pixel region R1 and shallow trench structure 82b formed in the periphery region R2. In some embodiments in which the shallow trench structure 82b is formed, the heavily doped region 103 (FIG. 5A) may be omitted. In other words, the heavily doped region 103 shown in FIG. 5A may be replaced by the shallow trench structure 82b. In some embodiments in which the shallow trench structures 82a are formed in the pixel region R1, the well regions 102a may be partially or completely omitted.

In some embodiments, the shallow trench structures 82 include a dielectric liner 80 and a conductive layer 81. The shallow trench structures 82 may be formed by the following processes. The substrate 100 is patterned to form trenches (e.g., shallow trenches) in the substrate 100. Thereafter, a dielectric material and a conductive material are formed on the substrate 100 to fill the trenches and cover the front surface 100f of the substrate 100. In some embodiments, a planarization process such as a chemical mechanical polishing (CMP) process may be performed to remove excess portions of the dielectric material and the conductive material over the front surface 100f of the substrate 100, and the remaining dielectric material and the remaining conductive material within the trench constitute the dielectric liners 80 and the conductive layers 81, respectively. In some embodiments, the top surfaces of the dielectric liner 80 and the conductive layer 81 of the shallow trench structures 82 may be substantially coplanar or level with the front surface 100f of the substrate 100. However, the disclosure is not limited thereto. In some other embodiments in which a pad oxide layer (not shown) is formed on the front surface 100f of substrate 100, the top surfaces of the shallow trench structures 82 may be substantially coplanar or level with the top surface of the pad oxide layer.

In some embodiments, the conductive material is or comprises doped polysilicon. Other materials are, however, amenable. In some embodiments in which the conductive material is or comprises doped polysilicon, formation of the conductive material filling the trenches comprises depositing the doped polysilicon, such that the doped polysilicon is doped as deposited. In other embodiments in which the conductive material is or comprises doped polysilicon, formation of the conductive material filling the trenches comprises depositing the conductive material undoped and subsequently doping the conductive material. The doping may, for example, be performed by ion implantation or by some other suitable doping process.

In some alternative embodiments, after the dielectric material and the conductive material are formed on the substrate 100, the dielectric material and the conductive material may be patterned by, for example, photolithography and etching processes. As such, the shallow trench structure 82 may be formed to further protrude from the front surface 100f of the substrate 100, as shown in FIG. 2H.

Figure 6A:
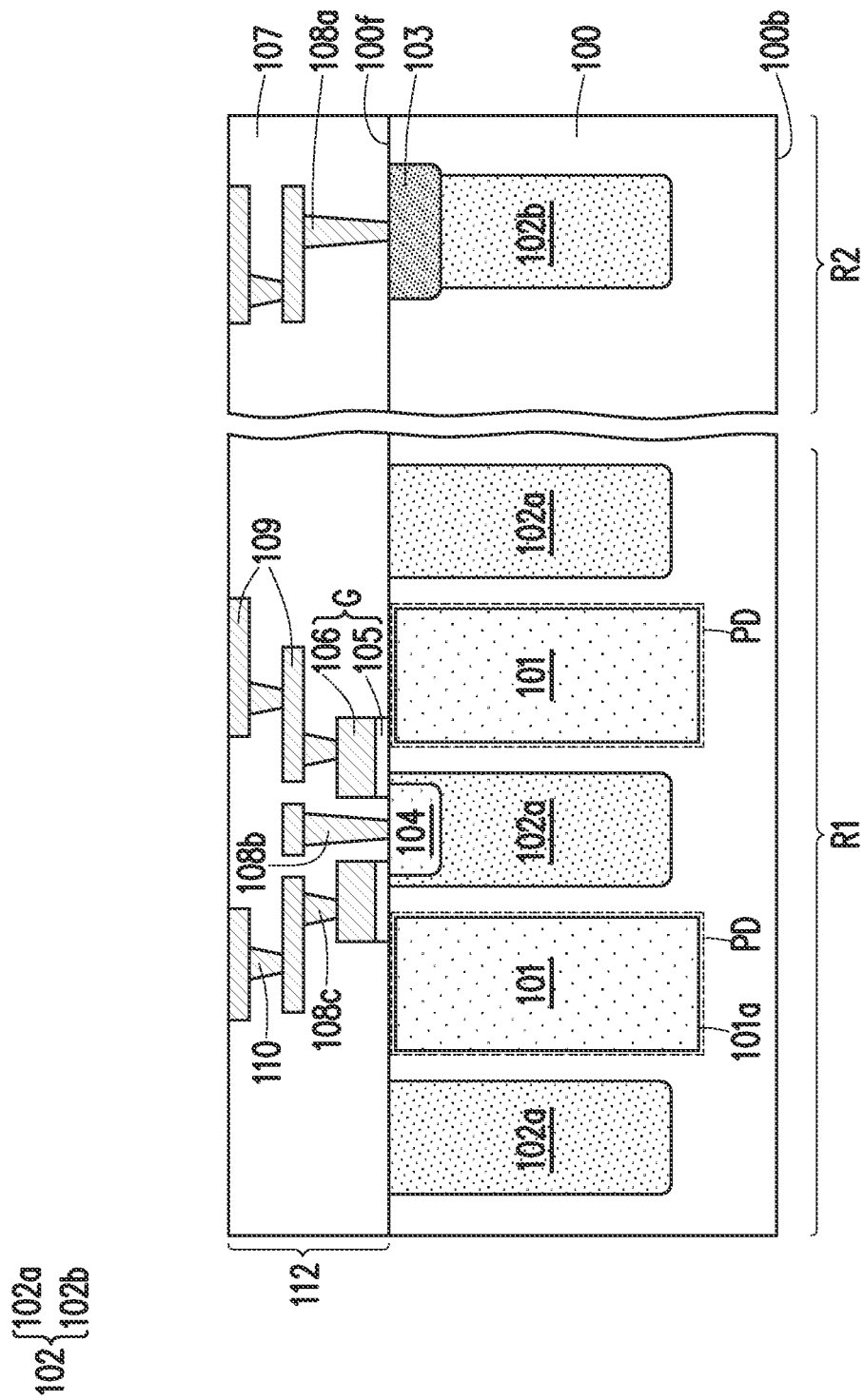

Referring to FIG. 6A, one or more transfer gate G is formed on the substrate 100. The transfer gate G may include a gate dielectric layer 105 and a gate electrode 106 on the gate dielectric layer 105. The formation of the transfer gates G may include depositing a dielectric layer and a conductive layer on the substrate 100, followed by patterning the dielectric layer and the conductive layer into the gate dielectric layers 105 and the gate electrodes 106. The dielectric layer may include silicon oxide, silicon nitride, silicon oxynitride, or a high-k dielectric material. The high-k dielectric material may have a dielectric constant such as greater than about 4, or greater than about 7 or 10. In some embodiments, the high-k dielectric material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, combinations thereof, or a suitable material. In alternative embodiments, the dielectric layer may optionally include a silicate such as HfSiO, LaSiO, AlSiO, combinations thereof, or a suitable material. The conductive layer may include polysilicon, such as doped polysilicon; metallic materials, such as copper, aluminum, tungsten, cobalt (Co), or the like or combinations thereof.

Figure 6B:
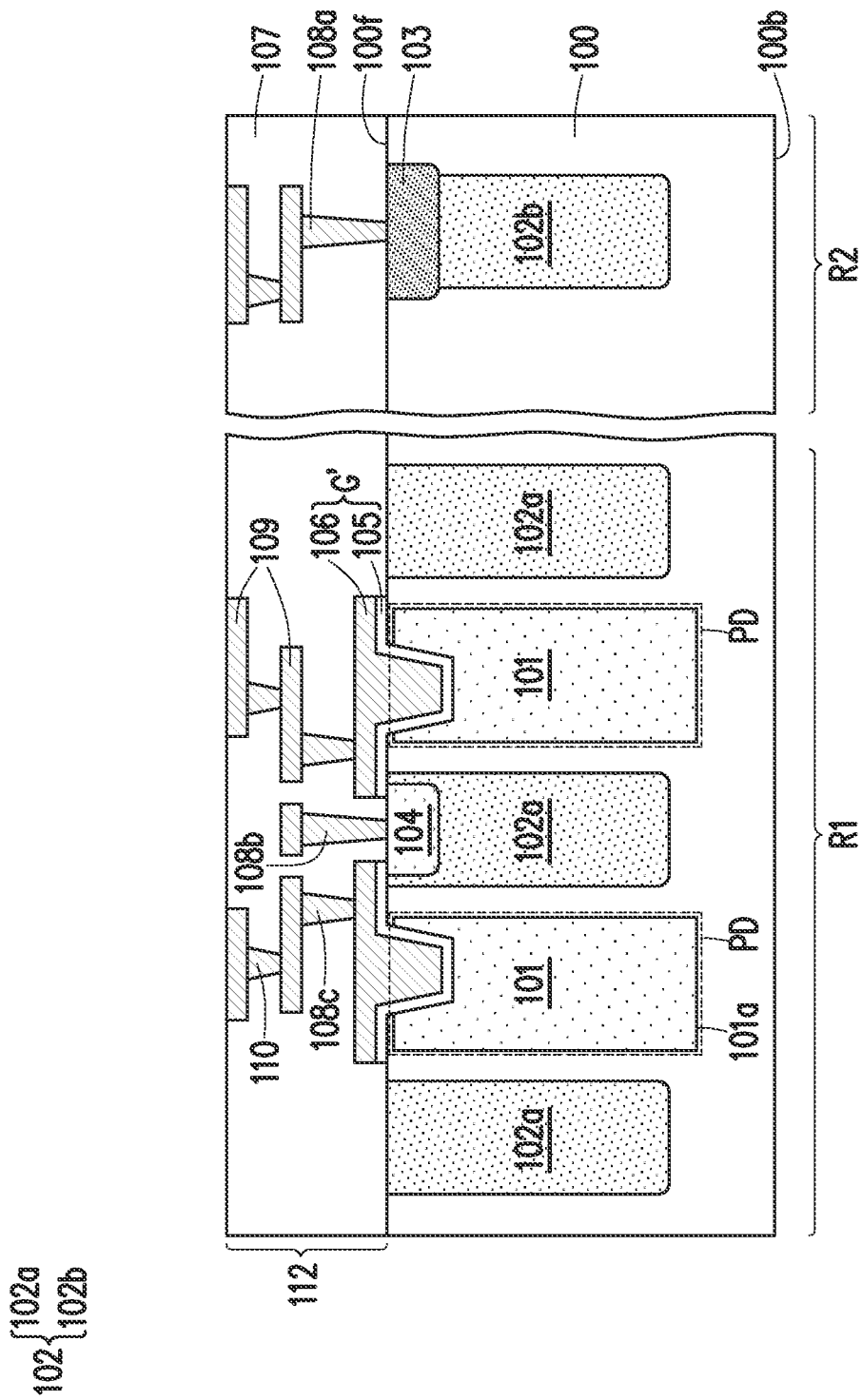

FIG. 6B illustrates an alternative process for forming a transfer gate G' according to some other embodiments of the disclosure. In some embodiments, before depositing the dielectric layer and the conductive layer for the transfer gate, a plurality of trenches (or referred to as recesses) are formed in the photodetectors PD. Thereafter, the dielectric layer and the conductive layer are formed on the front surface 100f of the substrate 100 and fill in the trenches. The dielectric layer and the conductive layer are then patterned to form the transfer gates G'. In such embodiments, portions of the dielectric layer and the conductive layer remained within the trench and on the front surface of the substrate constitute the transfer gates G'.

Referring back to FIG. 6A, in some embodiments, an interconnection structure 112 is formed on the front side of the substrate 100. The interconnection structure 112 includes a dielectric structure 107 and a plurality of conductive features (e.g., conductive contacts 108a-108c, conductive lines 109, and conductive vias 110) formed in the dielectric structure 107. The dielectric structure 107 includes a suitable dielectric material, such as silicon oxide, silicon nitride, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. The dielectric structure 107 may be a multi-layer structure, and may be formed by chemical vapor deposition (CVD), plasma enhanced-CVD (PECVD), flowable CVD (FCVD), spin coating or the like. The conductive features may include metal, metal alloy or a combination thereof, such as tungsten (W), copper (Cu), copper alloys, aluminum (Al), aluminum alloys, or combinations thereof. The formation of the conductive features may include a single damascene process, a dual damascene process, or a combination thereof. In some embodiments, the conductive contact 108a is formed within the periphery region R2 and landing on the heavily doped region 103 over the well region 102b. The pixel region RA may be free of conductive contacts formed to land on the doped regions 102a.

It is noted that, FIG. 5B and FIG. 6B illustrate some alternative processes of FIG. 5A and FIG. 6A according to some embodiments of the disclosure. The processes described below are illustrated as following the processes shown in FIG. 5A and FIG. 6A. It should be understood that, the processes described below may also be combined with the processes shown in FIG. 5B/6B to form alternative semiconductor devices, such as the semiconductor devices 500B-500I shown in FIG. 2A-FIG. 2H.

Figure 7:
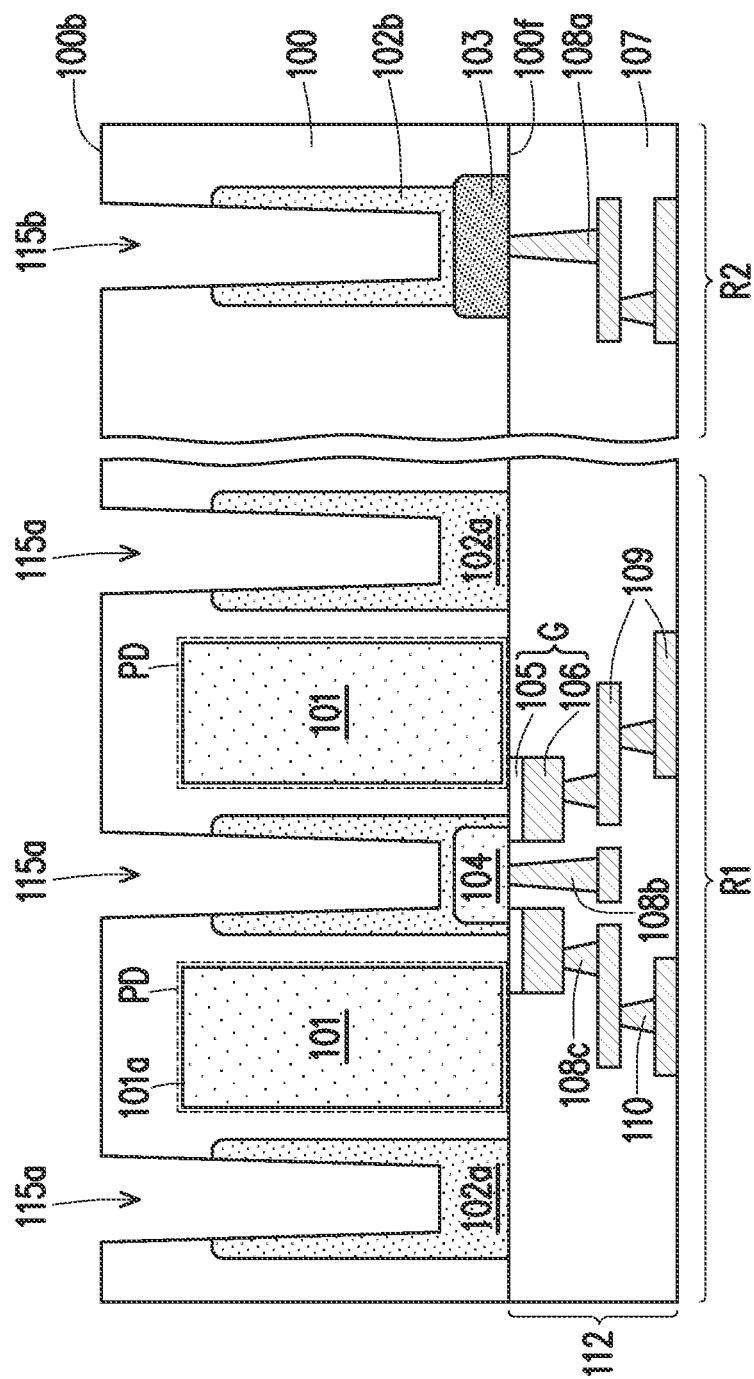

Referring to FIG. 6A and FIG. 7, in some embodiments, the structure shown in FIG. 6A is flipped upside down, such that the back side of the substrate 100 faces up for subsequent processes. In some embodiments, the structure may be bonded to a die (e.g., a logic die) and/or a carrier substrate (not shown).

In some embodiments, a patterning process is performed to form a plurality of openings 115 in the substrate 100. The openings 115 may include trenches (e.g., deep trenches), holes, or the like, or combinations thereof. In some embodiments, the openings 115 extend form the back surface 100b of the substrate 100 to the well regions 102. In some embodiments, the openings 115 at least expose top surfaces of the well regions 102 and may further extend into the well regions 102 to expose sidewalls of the well regions 102. In other words, the openings 115 penetrate through a portion of the substrate 100 and expose portions of the well regions 102. The patterning process may include photolithography and etching processes. For example, a patterned mask layer is formed on the back side of the substrate 100. The patterned mask layer may include a photoresist and/or one or more hard mask layers. The patterned mask layer has openings exposing portions of the substrate 100 and located directly over the well regions 102. Thereafter, an etching process using the patterned mask layer as an etching mask is performed to remove at least portions of the substrate 100 exposed by the patterned mask layer, so as to form the openings 115 and expose the well regions 102. In some embodiments, portions of the well regions 102 may also be etched, such that the openings 115 further extend into the well regions 102.

In some embodiments, the openings 115 include openings 115a formed in the pixel region R1 and an opening 115b formed in the periphery region R2. The openings 115a may be spatially connected to other and continuously extends around the photodetectors PD. For example, the openings 115a may be a continuous trench and may be configured as a grid shape. The opening 115b is separated from the opening 115a, and may include, via hole(s), trench(es), or the like or combinations thereof. In some embodiments, the openings 115b may be configured as ring-shaped and laterally surrounds the pixel region R1.

Figure 8:
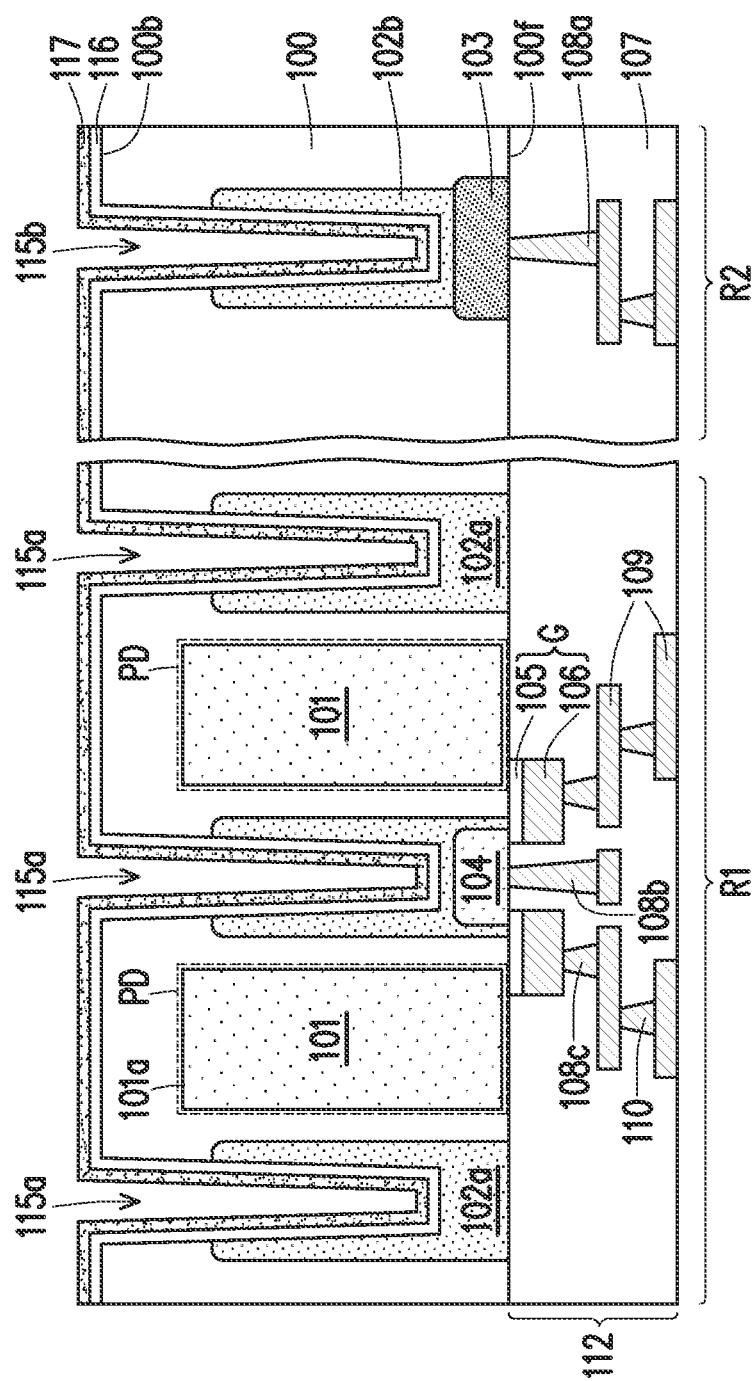

Referring to FIG. 8, in some embodiments, a dielectric layer 116 is formed on the substrate 100 and lining the surfaces of the openings 115. The dielectric layer 116 may also be referred to as a dielectric liner. The dielectric layer 116 may include a suitable dielectric material, such as silicon oxide, silicon nitride, silicon oxynitride, or a high-k dielectric material. The high-k dielectric material may include aluminum oxide (AlO), hafnium oxide (HfO), hafnium silicon oxide (HfSiO), hafnium aluminum oxide (HfAlO), or hafnium tantalum oxide (HMO), or the like, for example.

Thereafter, a spacer layer 117 may be formed on the dielectric layer 116. The spacer layer 117 is disposed on the back side of the substrate 100 and fills into the openings 115 to cover surfaces of the dielectric layer 116. The spacer layer 117 may include an oxide, such as silicon oxide, or other suitable dielectric material. In some embodiments, the formation of the spacer layer 117 and the dielectric layer 116 include deposition processes having good gap-filling ability, such as an atomic layer deposition (ALD), such that the spacer layer 117 and the dielectric layer 116 conformally line the surfaces of the openings 115. Herein, when a layer is described as conformal, it indicates that the layer has a substantially equal thickness extending along the region on which the layer is formed.

Figure 9:
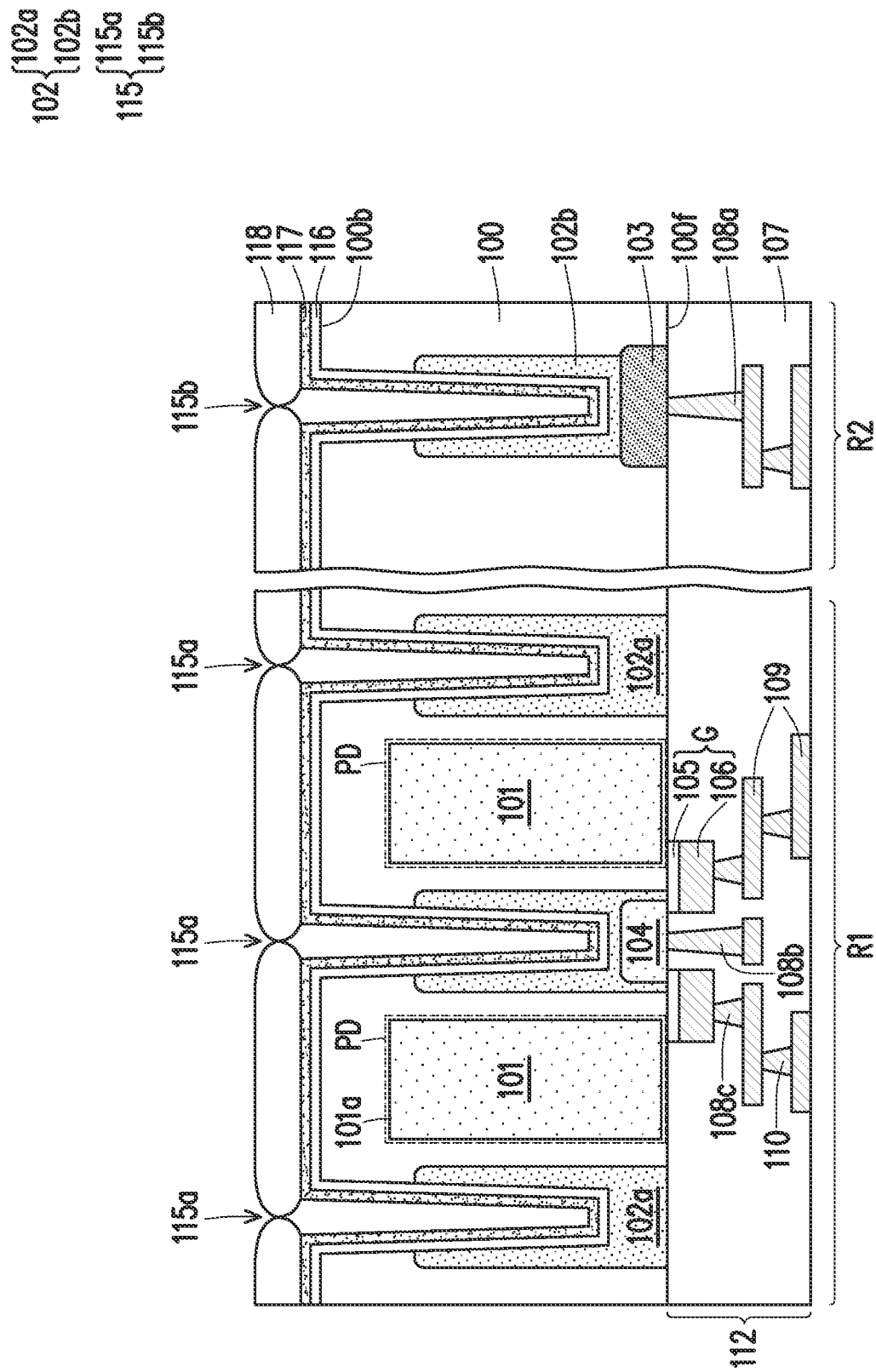

Referring to FIG. 9, in some embodiments, a dielectric layer 118 is formed on the substrate 100. The material of the dielectric layer 118 may include an oxide (e.g., silicon oxide), nitride (e.g., silicon nitride), oxynitride (e.g., silicon oxynitride), or the like, or combinations thereof. The dielectric layer 118 may include a single-layer structure or a multi-layer structure. In some embodiments, the dielectric layer 118 may include a first dielectric layer and a second dielectric layer on the first dielectric layer. The first dielectric layer may include an oxide, such as silicon oxide. The second dielectric layer may include a nitride, such as silicon nitride. However, the disclosure is not limited thereto.

In some embodiments, the dielectric layer 118 is formed by a deposition process having poor gap-filling ability, such as a PECVD process. As such, the dielectric layer 118 may be formed as a non-conformal layer. In some embodiments, the thickness of the dielectric layer 118 over the back surface 100b of the substrate 100 is much thicker than the thickness of the dielectric layer 118 within the openings 115. In some embodiments, the dielectric layer 118 is substantially not filled in the openings 115. In some embodiments, the tops of the openings 115 may be covered by the dielectric layer 118.

Figure 10:
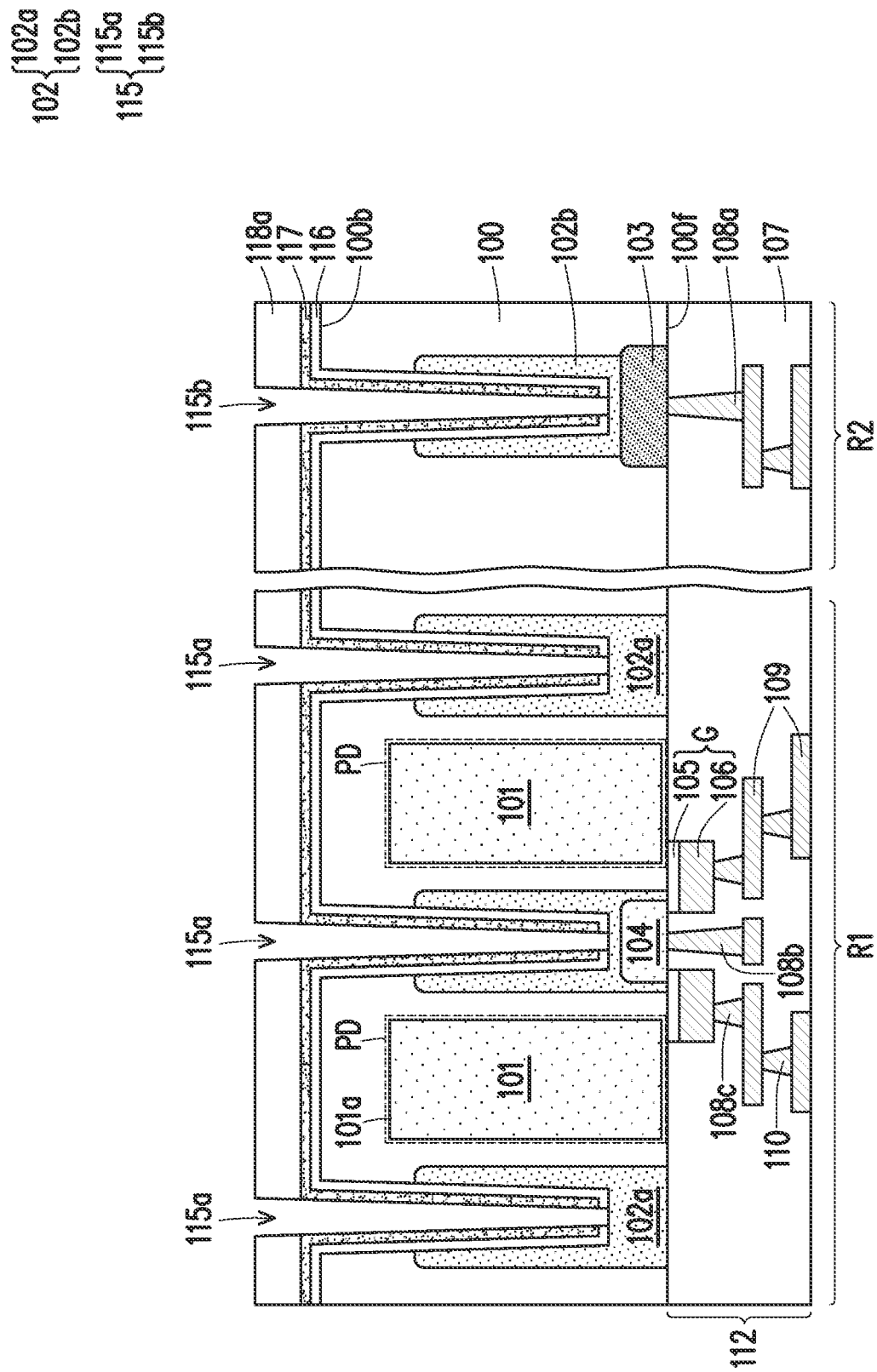

Referring to FIG. 9 and FIG. 10, in some embodiments, a removal process is performed to at least remove a portion of the dielectric layer 118 covering the tops of the openings 115, and portions of the dielectric layer 116, the spacer layer 117 and/or the dielectric layer 118 (if any) at the bottom of the openings 115, such that the openings 115 are re-exposed and the well regions 102 are exposed by the openings 115. The removal process may include a blanket etching process. The etching process may reduce the thickness of the dielectric layer 118, such that a dielectric layer 118a is formed. In some embodiments, after the removal process is performed, the bottoms of the openings 115 expose the well regions 102, and the sidewalls of the openings 115 are covered by the dielectric layer 116 and the spacer layer 117. The dielectric layer 118a includes openings directly over the openings 115.

Figure 11:
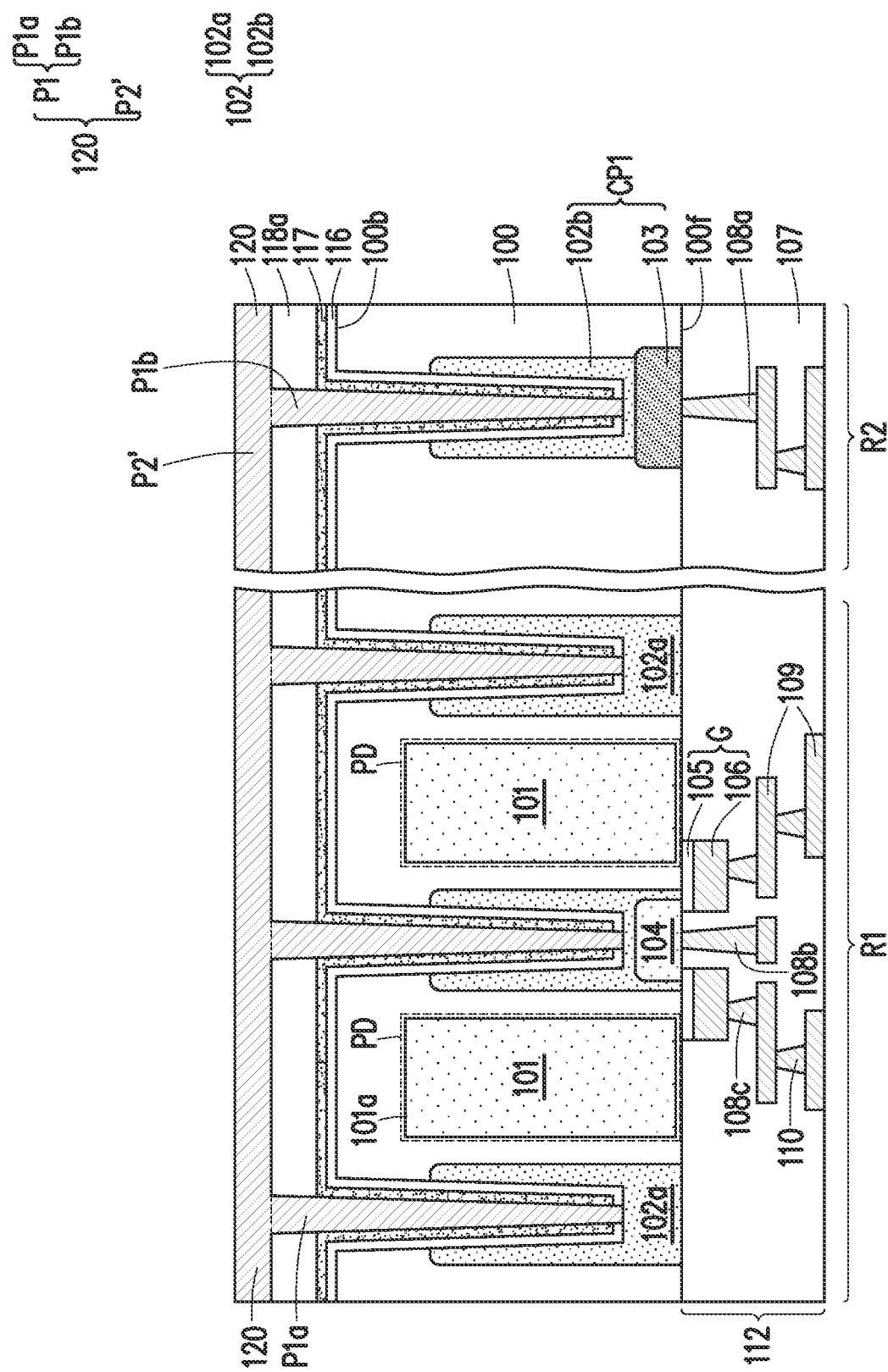

Referring to FIG. 11, a conductive material layer 120 is formed over the substrate 100 to cover the top surface of the dielectric layer 118a and fill into the openings 115 and the openings of the dielectric layer 118a. The conductive material layer 120 may include a metal and/or a metal alloy, such as tungsten (W), copper (Cu), AlCu, Al, the like, or combinations thereof. In some embodiments, the formation of the conductive material layer 120 may include a deposition process such as CVD, PVD, or the like; a plating process; or combination thereof. In some embodiments, the formation of the conductive material layer 120 may further include a planarization process, such as a CMP process, such that the conductive material layer 120 is formed to have a substantially planar top surface. The conductive material layer 120 includes first portions (e.g., conductive plugs) P1 embedded in the substrate 100 and the dielectric layer 118a, and a second portion (e.g., an upper portion) P2' extending on the top surface of the dielectric layer 118a.

Figure 12A:
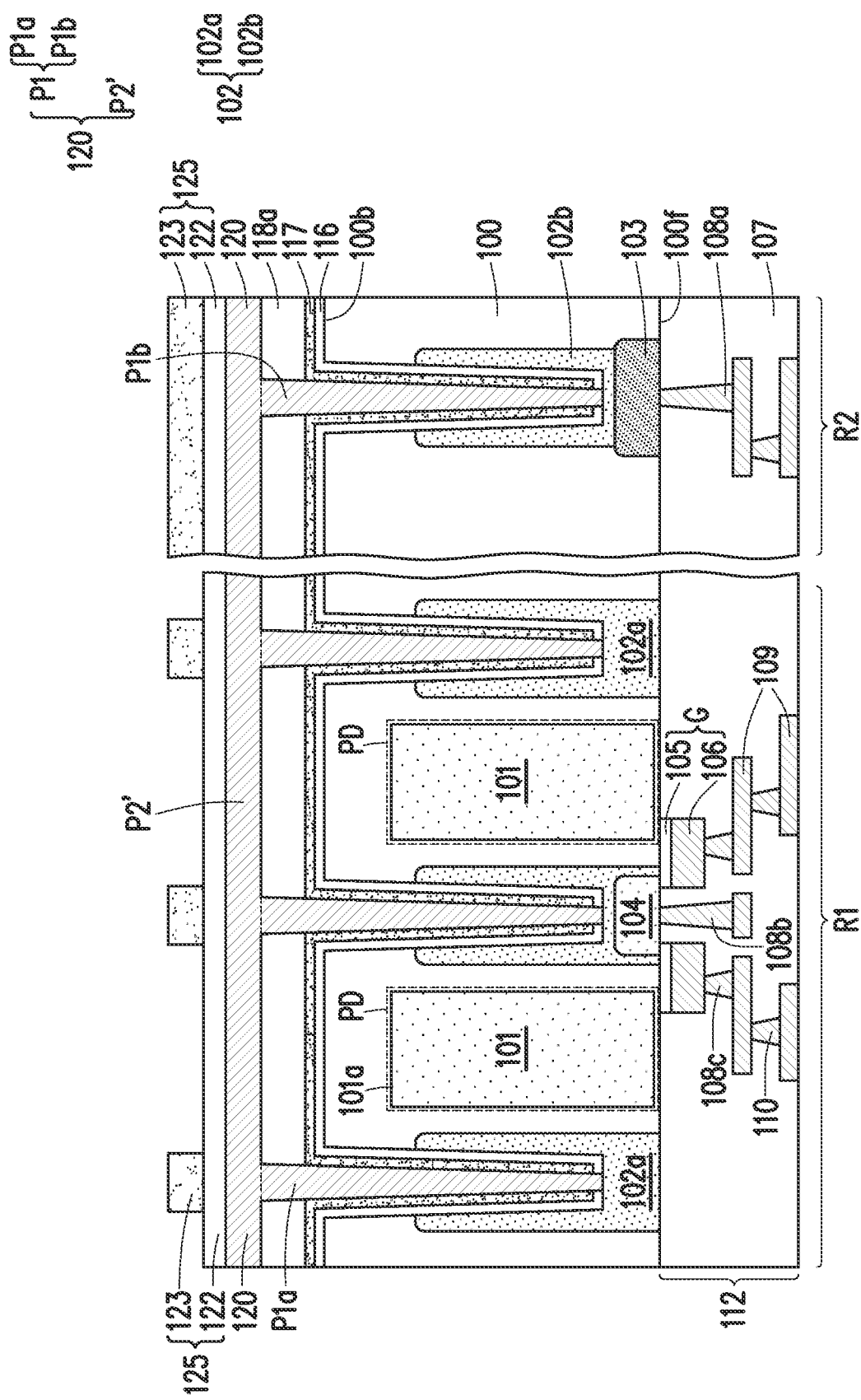

FIG. 12A and FIG. 12B to FIG. 13A and FIG. 13B illustrate the patterning of the conductive material layer 120 according to some embodiments of the disclosure. FIG. 12A/13A and FIG. 12B/13B illustrate cross-sectional views of semiconductor devices in intermediate stages of fabrication process, and are taken along lines I-I' and II-II' of FIG. 3A, respectively.

Figure 12B:
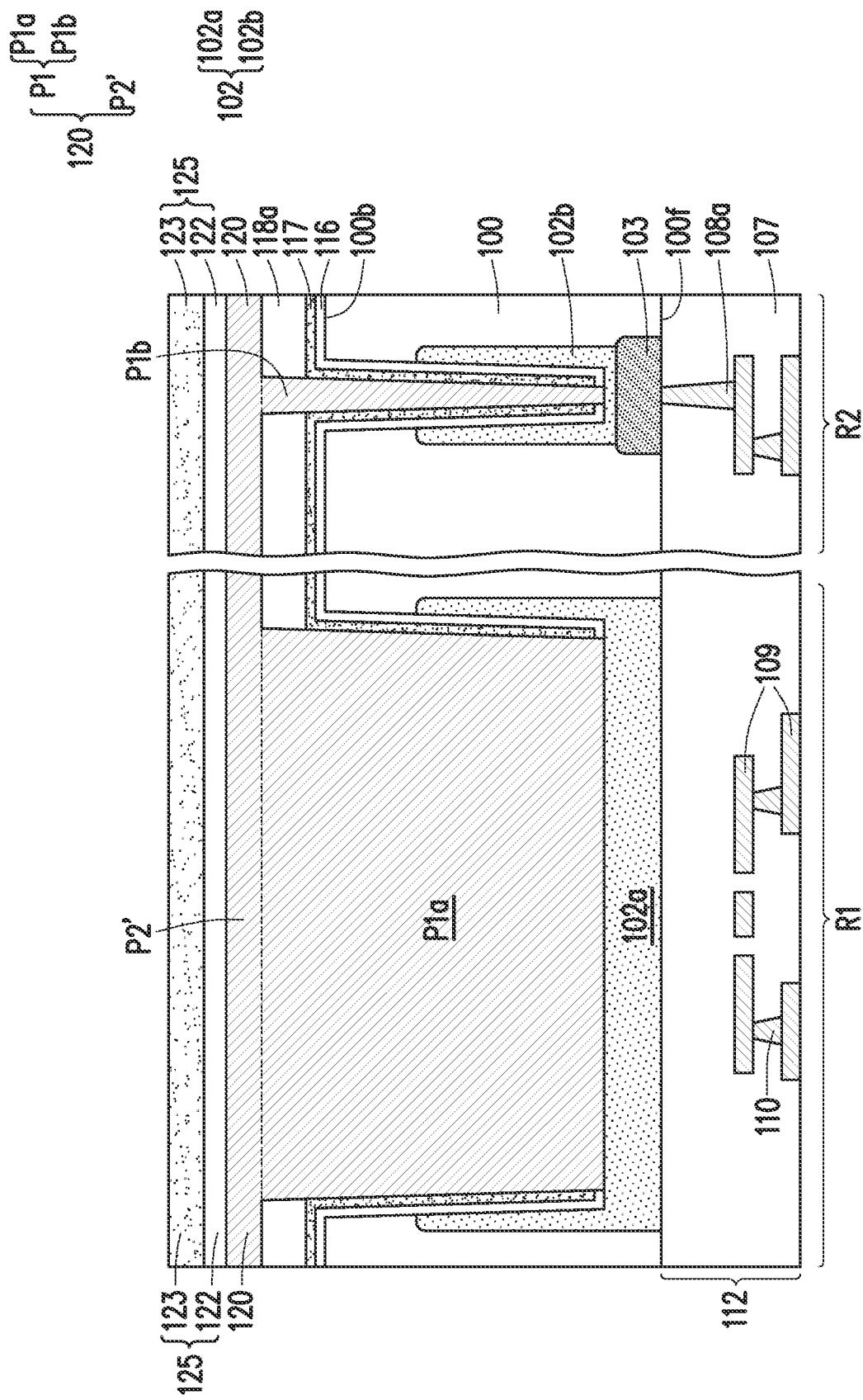

Referring to FIG. 11, FIG. 12A and FIG. 12B, in some embodiments, a mask layer 125 is formed on the conductive material layer 120. The mask layer 125 may include a hard mask layer 122, and a patterned photoresist 123 disposed on the hard mask layer 122. The patterned photoresist 123 include patterns configured for patterning the conductive material layer 120. In some embodiments, the patterned photoresist 123 has different patterns in the pixel region R1 and the periphery region R2. For example, the patterned photoresist 123 may have grid pattern or mesh pattern within the pixel region R1, and may have a via pattern, a trench pattern, a plate pattern or combinations thereof within the periphery region R2. The hard mask layer 122 may be a single-layer structure or a multi-layer structure. In some embodiments, the hard mask layer 122 includes any suitable hard mask material, including oxides and/or nitrides, such as silicon oxide, silicon nitride, silicon oxynitride, titanium oxide, titanium nitride (TiN), SiOC, tetraethosiloxane tetraethyl orthosilicate (TEOS), or the like or combinations thereof. In some embodiments, an anti-reflection layer may be disposed in the hard mask layer 122 or disposed between the hard mask layer 122 and the conductive material layer 120.

Figure 13A:
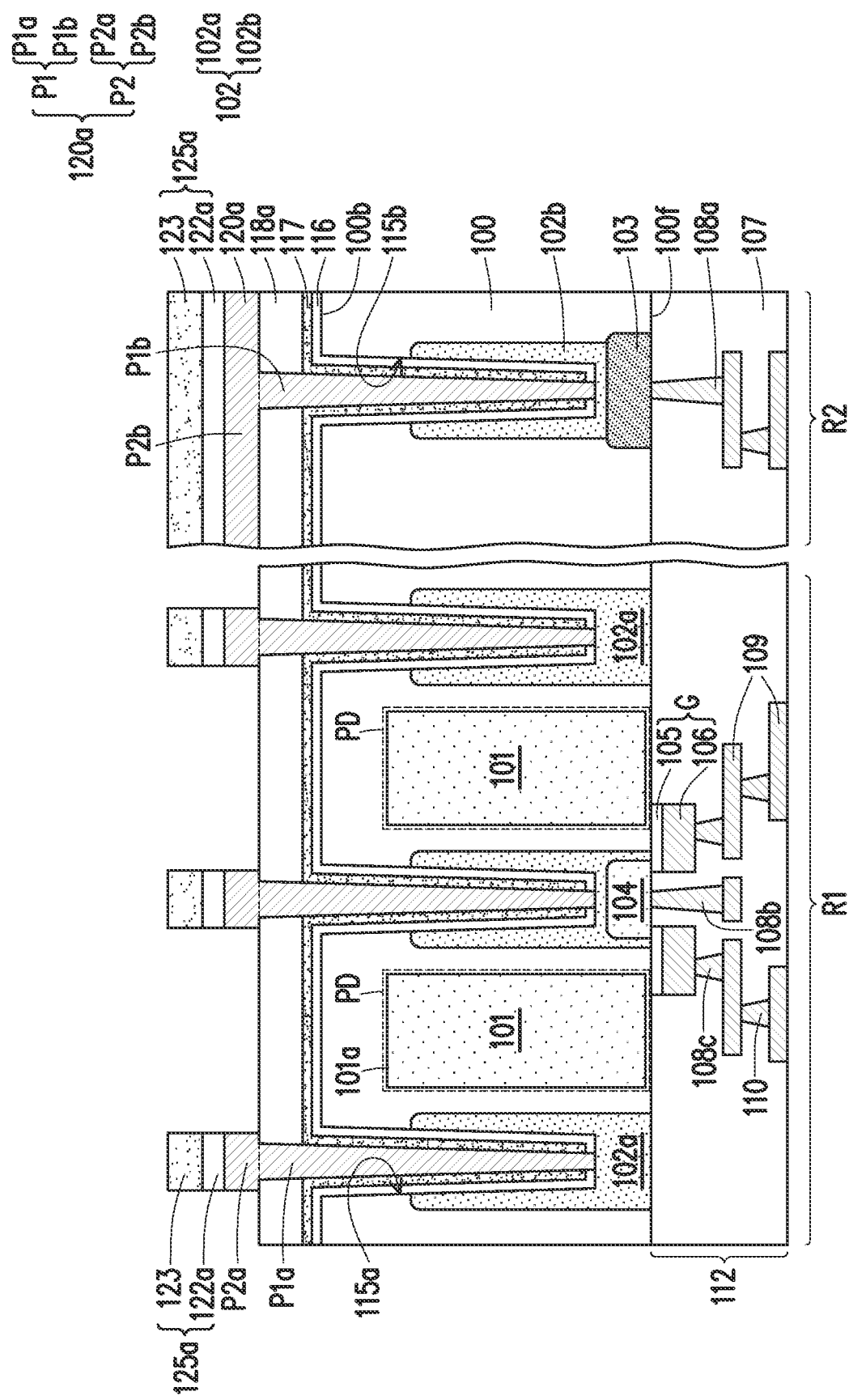
Figure 13B:
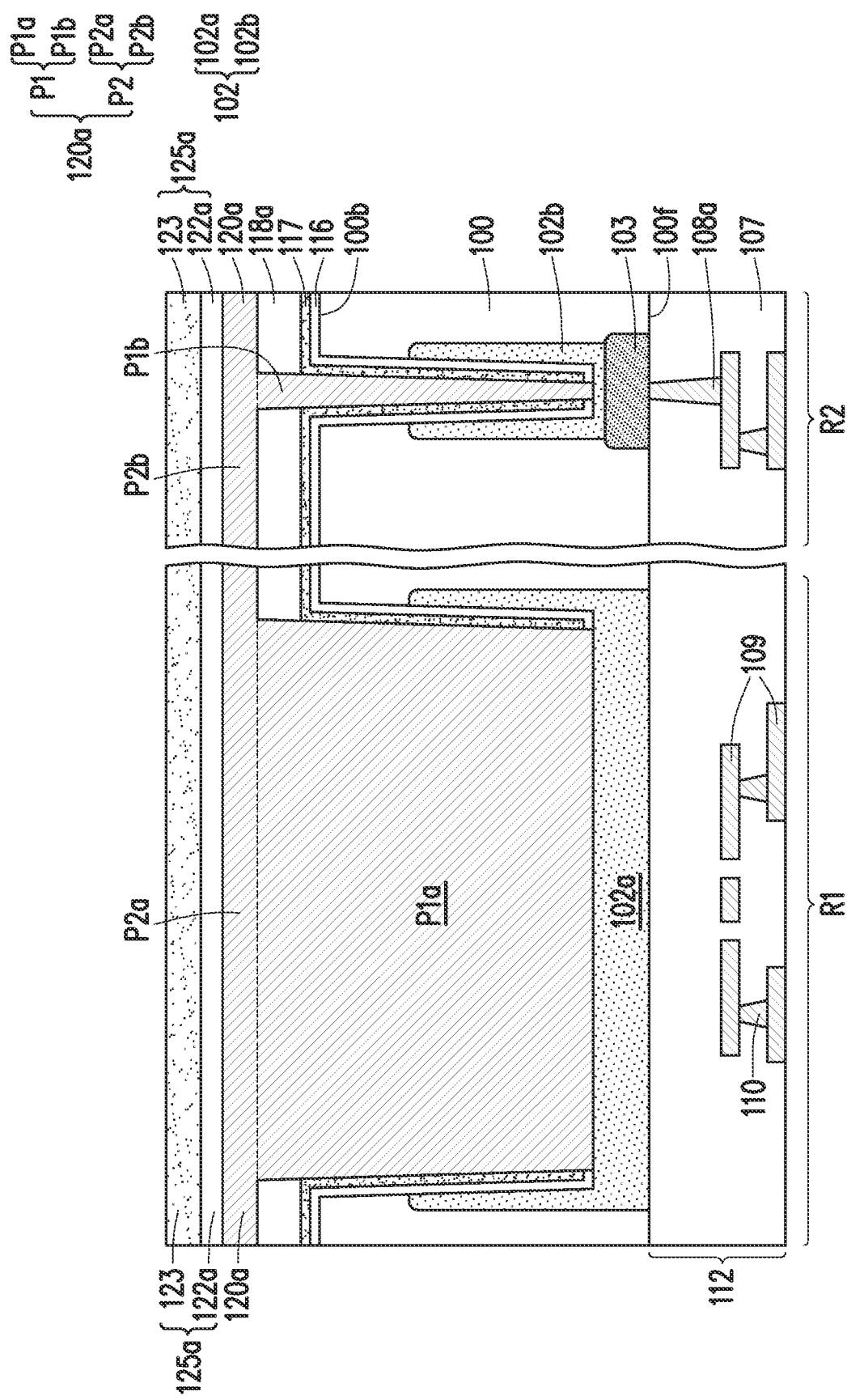

Referring to FIG. 12A/FIG. 12B and FIG. 13A/FIG. 13B, a patterning process is then performed on the conductive material layer 120 according to the mask layer 125. Specifically, the patterning process is performed on the upper portion P2' of the conductive material layer 122. In some embodiments, the hard mask 122a is etched with the patterned photoresist 123 as an etching mask, such that the pattern of the photoresist 123 is transferred into the hard mask layer 122, and a patterned mask layer 125a including a hard mask 122a is formed. In some embodiments, during the etching of the hard mask layer 122, the patterned photoresist 123 may be partially or completely consumed. Thereafter, the conductive material layer 120 is etched using the patterned mask layer 125a as an etching mask, such that the pattern of the patterned mask layer 125a is transferred into the upper portion P2' of the conductive material layer 120, and a conductive structure 120a including first portions (conductive plugs) P1 and second portions (conductive cap) P2 is formed. The conductive plugs P1 includes conductive plugs P1a disposed in the pixel region R1 and conductive plug(s) P1b disposed in the periphery region R2. The conductive cap P2 continuously extends from the pixel region R1 to the periphery region R2 and is electrically/physically connected to the conductive plugs P1a and P1b. The detailed configurations of the conductive cap P2 and the conductive plugs P1 may be referred to those described with respect to FIG. 1A, FIG. 1B and FIG. 3A, which are not described again here.

Figure 14:
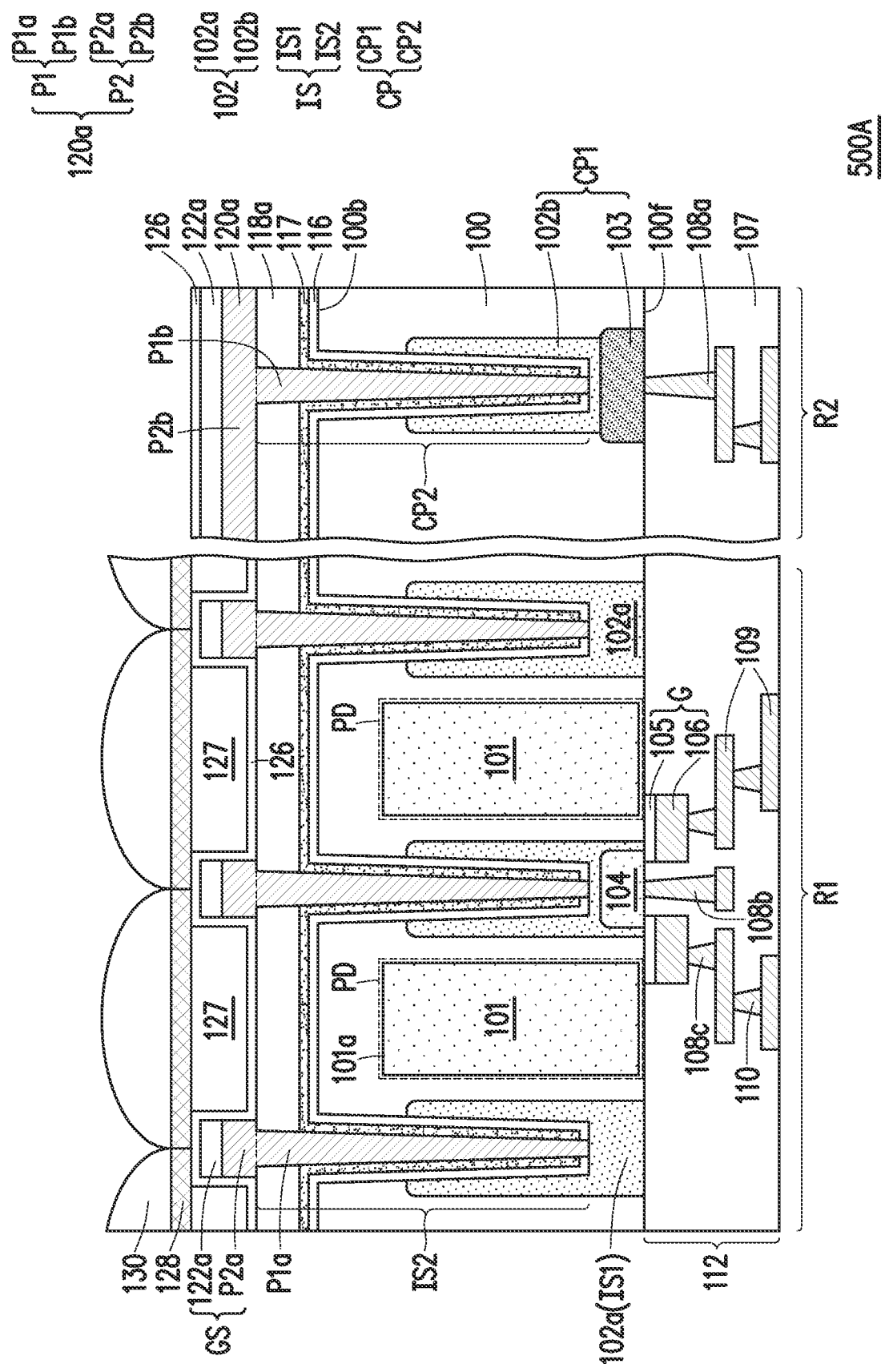

Referring to FIG. 13A and FIG. 14, the patterned mask layer 125a is partially or completely removed. In some embodiments, the patterned photoresist 123 (if any) is removed, and the hard mask 122a may optionally remain on the conductive structure 120a. In some embodiments, the hard mask 122a is also removed. In the embodiments in which the hard mask 122a remains, the hard mask 122a and the conductive cap P2a of the conductive structure 120a in the pixel region R1 may be collectively referred to as a grid structure GS. Referring to FIG. 14, in some embodiments, a spacer layer 126 is formed over the substrate 100 to cover/line the surfaces of the conductive structure 120a, the hard mask 122a and/or the dielectric layer 118a. The spacer layer 126 includes a dielectric material, such as an oxide (e.g., silicon oxide), but the disclosure is not limited thereto. The spacer layer 126 may also be referred to as a dielectric liner.

Thereafter, a dielectric layer 127 may be formed over the substrate 100 and filling the openings of the grid structure GS. The dielectric layer 127 may include an oxide, such as silicon oxide, a nitride such as silicon nitride, or an oxynitride such as silicon oxynitride, or other suitable dielectric material. The dielectric layer 127 may be formed by the following processes. A dielectric material is deposited over the substrate 100 to cover the grid structure GS and the spacer layer 126. Thereafter, a planarization process (e.g., a CMP) may be performed to remove a portion of the dielectric material over the topmost surface of the spacer layer 126, so as to form the dielectric layer 127 laterally aside the grid structure GS and the spacer layer 126.

Thereafter, a plurality of light filters (e.g., color filters) 128 are formed over the photodetectors PD within the pixel region R1. The light filters 128 may be respectively formed of materials that allow light of the corresponding wavelengths to pass therethrough, while blocking light of other wavelengths. In some embodiments, lights filters 128 configured for transmitting light of different wavelengths are disposed alternatingly. For example, a first light filter (e.g., a red light filter) may transmit light having wavelengths within a first range, a second light filter (e.g., a green light filter) may transmit light having wavelengths within a second range different than the first range, and a third light filter (e.g., a blue light filter) may transmit light having wavelengths within a third range different than the first and second ranges. The process for forming the light filters 128 may include forming a light filter layer and patterning the light filter layer using photolithography and etching processes, for example. In the present embodiments, the light filters 128 are formed on the grid structure GS and the dielectric layer 127, but the disclosure is not limited thereto. In some other embodiments, as shown in FIG. 2H, the formation of the dielectric layer 127 (FIG. 14) may be omitted, and the light filters 128 may be formed in the openings of the grid structure GS.

A plurality of lenses 130 are formed on the light filters 128. In some embodiments, the lenses 130 have substantially flat bottom surfaces abutting the light filters 128 and further have curved upper surfaces. The curved upper surfaces are configured to focus the incident light towards the underlying photodetectors PD.

In the embodiments of the disclosure, the BDTI structures used for isolating photodetectors in the pixel region are formed with conductive material, and the conductive grid disposed over the BDTI structures extends from the pixel region to the periphery region and electrically connects the BDTI structures to a conductive plug structure disposed in the periphery region. As such, an isolation bias may be provided to the BDTI structures through the conductive plug structure from the periphery region, and enhanced isolation may be achieved by providing a negative bias to the BDTI structures. Accordingly, the heavily doped regions formed in the pixel region for providing isolation bias are omitted, and undesired P-N junctions that may be formed between the heavily doped regions and the photodetectors are avoided, thereby avoiding junction leakage that may be caused by the undesired P-N junctions and further avoiding issues such as dark current or white pixels that may result from the junction leakage. Further, since heavily doped regions for providing isolation bias in the pixel region are omitted, the area for the photodetectors in the pixel region is improved. In addition, since the BDTI structures include metallic material, the BDTI structures may also acts as reflectors, which may improve the quantum efficiency of the image sensor. Therefore, the performance of the image sensor is improved.

In accordance with some embodiments of the disclosure, a semiconductor device includes a substrate, a plurality of photodetectors, an isolation structure, a conductive plug structure, a conductive cap and a conductive contact. The substrate has a front side and a back side opposite to each other. The photodetectors are disposed in the substrate within a pixel region. The isolation structure is disposed within the pixel region and between the photodetectors. The isolation structure includes a back side isolation structure extending from the back side of the substrate to a position in the substrate. The conductive plug structure is disposed in the substrate within a periphery region. The conductive cap is disposed on the back side of the substrate and extends from the pixel region to the periphery region and electrically connects the back side isolation structure to the conductive plug structure. The conductive contact lands on the conductive plug structure, and is electrically connected to the back side isolation structure through the conductive plug structure and the conductive cap.

In accordance with some embodiments of the disclosure, a semiconductor device includes a substrate having a front side and a back side opposite to each other, a plurality of photodetectors, conductive plug structures, a conductive cap, and a first conductive contact. The photodetectors are disposed in substrate within a pixel region. The conductive plug structures extend from the back side of the substrate to a position in the substrate. The conductive plug structures include a first plug structure disposed within the pixel region and isolating the photodetectors from each other; and a second plug structure disposed within a periphery region and laterally spaced apart from the first plug structure. The conductive cap extends from the pixel region to the periphery region and electrically connects the first plug structure to the second plug structure. The first conductive contact is disposed within the periphery region and is configured for providing an isolation bias to the first plug structure through the second plug structure and the conductive cap.

In accordance with some embodiments of the disclosure, a method of forming a semiconductor device includes: providing a substrate having a front side and a back side opposite to each other; forming a plurality of photodetectors in the substrate within a pixel region; patterning the substrate from the back side to form a first opening within a pixel region and a second opening within a periphery region; forming a conductive material layer on the substrate and filling into the first and second openings, wherein the conductive material layer includes a first conductive plug in the first opening, a second conductive plug in the second opening, and an upper portion over the back side of the substrate, and wherein the first conductive plug serves as a first portion of an isolation structure disposed between the photodetectors; patterning the upper portion of the conductive material layer to form a conductive cap, wherein the conductive cap extends from the pixel region to the periphery region and is electrically connected to the first and second conductive plugs; and forming a conductive contact on the second conductive plug over the front side of the substrate within the periphery region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   providing a substrate having a front side and a back side opposite to each other;
   forming a plurality of photodetectors in the substrate within a pixel region;
   patterning the substrate from the back side of the substrate to form a first opening within the pixel region and a second opening within a periphery region;
   forming a dielectric liner on sidewalls and bottom surfaces of the first and second openings;
   removing a portion of the dielectric liner covering the bottom surfaces of the first and second openings;
   forming a conductive material layer after the removing, wherein the conductive material layer is formed on the substrate and filling into the first and second openings, wherein the conductive material layer comprises a first conductive plug in the first opening, a second conductive plug in the second opening, and an upper portion over the back side of the substrate, and wherein the first conductive plug serves as a first portion of an isolation structure disposed between the plurality of photodetectors;
   patterning the upper portion of the conductive material layer to form a conductive cap, wherein the conductive cap extends from the pixel region to the periphery region and is electrically connected to the first and second conductive plugs; and
   forming a conductive contact on the second conductive plug over the front side of the substrate within the periphery region.

2. The method of claim 1, further comprising:
   forming a first well region and a second well region in the substrate within the pixel region and the periphery region from the front side of the substrate, respectively, wherein the first opening and the second opening are respectively formed to extend from the back side of the substrate to the first well region and the second well region, respectively, and wherein the first well region serves as a second portion of the isolation structure.

3. The method of claim 2, further comprising:
forming a doped contact region on the second well region, wherein the doped contact region has a same doping type as, and a higher doping concentration than, the second well region, wherein the conductive contact extends to the doped contact region, and wherein the second well region has a lesser height than the first well region.

4. The method of claim 2, wherein the conductive contact extends to a surface of the substrate and is spaced from the second well region, and wherein the first well region extends into the substrate from the surface of the substrate.

5. The method of claim 1, wherein the first conductive plug has a grid-shaped top geometry, and wherein the second conductive plug has a ring-shaped top geometry surrounding the grid-shaped top geometry.

6. A method of forming a semiconductor device, comprising:
forming an array of photodetectors in a pixel region of a substrate;
forming a first well region and a second well region in the substrate, wherein the first well region extends into the substrate from a front side surface of the substrate and has a first grid-shaped top geometry separating each photodetector of the array of photodetectors from each other, and wherein the second well region is outside the pixel region;
forming a contact region in the substrate and separating the second well region from the front side surface of the substrate;
patterning the substrate to form a first opening and a second opening extending from a back side surface of the substrate, opposite the front side surface of the substrate, respectively to the first and second well regions, wherein the first opening has a second grid-shaped top geometry separating each photodetector of the array of photodetectors from each other;
depositing a metal layer filling the first and second openings; and
patterning the metal layer to form a plurality of third openings respectively overlying the array of photodetectors.

7. The method of claim 6, wherein the patterning of the metal layer forms a first plurality of line-shaped metal segments extending in parallel along rows of the array of photodetectors, and further forms a second plurality of line-shaped metal segments extending in parallel along columns of the array of photodetectors, and wherein the second plurality of line-shaped metal segments intersect the first plurality of line-shaped metal segments.

8. The method of claim 6, further comprising:
depositing a liner layer lining and partially filling the first opening;
depositing a dielectric layer covering the back side surface of the substrate, and further covering the first opening without filling the first opening, wherein a thickness of the dielectric layer is less directly over the first opening than directly over the back side surface of the substrate; and
performing a blanket etch into the liner layer and the dielectric layer to expose the first well region in the first opening before the depositing of the metal layer.

9. The method of claim 8, wherein the liner layer is further deposited lining and partially filling the second opening, and wherein the dielectric layer is further deposited covering the second opening without filling the second opening.

10. The method of claim 6, further comprising:
forming a doped region recessed into the first well region, wherein the doped region has an opposite doping type as the first well region; and
forming a pair of gate electrodes on the front side surface of the substrate, wherein a portion of the doped region is between and borders the pair of gate electrodes.

11. The method of claim 6, wherein the contact region has a same doping type as the second well region and further has a different doping concentration than the second well region.

12. The method of claim 6, wherein the second well region extends in a first closed path around the first grid-shaped top geometry, and wherein the second opening extends in a second closed path around the second grid-shaped top geometry.

13. A method of forming a semiconductor device, comprising:
forming an array of photodetectors in a substrate;
forming a front side isolation structure and a front side plug extending into the substrate from a front side of the substrate, wherein the front side isolation structure individually surrounds each photodetector of the array of photodetectors, and wherein the front side plug is laterally offset from the array of photodetectors;
patterning a back side of the substrate, opposite the front side of the substrate, to form a first opening and a second opening respectively exposing the front side isolation structure and the front side plug;
depositing a conductive layer filling the first and second openings, wherein the conductive layer forms a back side isolation structure and a back side plug extending into the substrate from the back side of the substrate respectively to the front side isolation structure and the front side plug; and
forming an interconnect structure on the front side of the substrate, wherein the interconnect structure directly contacts the front side plug while being spaced from the front side isolation structure, and further electrically couples to the front side isolation structure indirectly via the conductive layer and the front side plug.

14. The method of claim 13, wherein the front side isolation structure consists essentially of a first well, and wherein the front side plug consists essentially of a contact region and a second well, and wherein the first well, the second well, and the contact region share a common doping type in the substrate.

15. The method of claim 14, wherein the front side isolation structure and the front side plug have a same height.

16. The method of claim 14, wherein the second opening is spaced from the contact region.

17. The method of claim 13, further comprising:
performing an etch selectively into the conductive layer to remove portions of the conductive layer directly over the array of photodetectors.

18. The method of claim 13, further comprising:
forming a doped semiconductor region recessed into the front side isolation structure; and
forming a pair of gate electrodes on the front side of the substrate, wherein a portion of the doped semiconductor region is between and borders the pair of gate electrodes.

19. The method of claim 13, wherein the forming of the front side isolation structure and the front side plug comprises:
forming a first well region and a second well region in the substrate from the front side of the substrate, wherein the first opening and the second opening are respectively formed to extend from the back side of the substrate respectively to the first well region and the second well region, wherein the first well region forms the front side isolation structure, and wherein the second well region partially forms the front side plug.

20. The method of claim 13, wherein the back side isolation structure has a grid-shaped top geometry, and wherein the back side plug has a ring-shaped top geometry surrounding the grid-shaped top geometry.

* * * * *